(12) United States Patent
Kawae

(10) Patent No.: US 8,289,052 B2
(45) Date of Patent: Oct. 16, 2012

(54) LOGIC CIRCUIT AND DISPLAY DEVICE HAVING THE SAME

(75) Inventor: Daisuke Kawae, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/894,881

(22) Filed: Sep. 30, 2010

(65) Prior Publication Data

US 2011/0084731 A1    Apr. 14, 2011

(30) Foreign Application Priority Data

Oct. 9, 2009    (JP) ................................. 2009-235165

(51) Int. Cl.
H03K 19/00    (2006.01)
H03K 19/20    (2006.01)
H03K 19/094   (2006.01)
H01L 25/00    (2006.01)

(52) U.S. Cl. ....................................... 326/102; 326/112

(58) Field of Classification Search ............... 326/80–83, 326/93–95, 101, 102, 104, 112, 115, 119, 326/121

See application file for complete search history.

(56) References Cited

U.S. PATENT DOCUMENTS

| | | | | |
|---|---|---|---|---|
| 7,349,190 | B1 * | 3/2008 | Maheedhar et al. | 361/92 |
| 7,403,037 | B2 * | 7/2008 | Haraguchi | 326/83 |
| 7,646,367 | B2 | 1/2010 | Kimura | |
| 7,674,650 | B2 | 3/2010 | Akimoto et al. | |
| 7,687,808 | B2 * | 3/2010 | Umezaki | 257/72 |
| 7,964,876 | B2 * | 6/2011 | Umezaki | 257/72 |
| 2008/0062112 | A1 * | 3/2008 | Umezaki | 345/100 |
| 2008/0079001 | A1 * | 4/2008 | Umezaki et al. | 257/59 |
| 2008/0079685 | A1 * | 4/2008 | Umezaki et al. | 345/100 |
| 2008/0136990 | A1 | 6/2008 | Kimura | |
| 2008/0284768 | A1 | 11/2008 | Yoshida et al. | |

FOREIGN PATENT DOCUMENTS

| | | |
|---|---|---|
| JP | 61-105117 | 5/1986 |
| JP | 01-305722 | 12/1989 |
| JP | 06-216756 | 8/1994 |
| JP | 2005-318376 | 11/2005 |
| JP | 2007-096055 | 4/2007 |
| JP | 2007-123861 | 5/2007 |

OTHER PUBLICATIONS

International Search Report (Application No. PCT/JP2010/066110) Dated Nov. 22, 2010.
Written Opinion (Application No. PCT/JP2010/066110) Dated Nov. 22, 2010.

* cited by examiner

*Primary Examiner* — Shawki S Ismail
*Assistant Examiner* — Dylan White
(74) *Attorney, Agent, or Firm* — Eric J. Robinson; Robinson Intellectual Property Law Office, P.C.

(57) ABSTRACT

It is an object to provide a logic circuit which can be operated even when unipolar transistors are used. A logic circuit includes a source follower circuit and a logic circuit an input portion of which is connected to an output portion of the source follower circuit and all transistors are unipolar transistors. A potential of a wiring for supplying a low potential connected to the source follower circuit is lower than a potential of a wiring for supplying a low potential connected to the logic circuit which includes unipolar transistors. In this manner, a logic circuit which can be operated even with unipolar depletion transistors can be provided.

26 Claims, 15 Drawing Sheets

LOGIC CIRCUIT AND DISPLAY DEVICE HAVING THE SAME

TECHNICAL FIELD

The present invention relates to a logic circuit. The present invention also relates to a semiconductor device having the logic circuit, in particular, to a display device.

BACKGROUND ART

In recent years, research and development have been extensively conducted on thin film transistors and semiconductor devices using thin film transistors.

Silicon is most widely used as a semiconductor material of thin film transistors. As semiconductor devices, display devices (liquid crystal display devices, EL display devices, and the like) are given, for example.

In thin film transistors applied to display devices, amorphous silicon and crystalline silicon are used in accordance with the usage. For example, amorphous silicon is used for large display devices. However, in the case where higher field effect mobility is desired to be obtained, for example, in the case where a liquid crystal display device is operated with double-frame rate driving, amorphous silicon does not sufficiently meet such a need.

Thus, when low-temperature polysilicon which is a kind of crystalline silicon is used for a liquid crystal display device, a driver circuit can be formed over a glass substrate, and a narrower frame and a high definition of the display device can be obtained. Alternatively, when high-temperature polysilicon which is a kind of crystalline silicon is used, higher definition can be obtained as compared to the case of using low-temperature polysilicon, so that high-temperature polysilicon is applied to pixels in a projector, or the like.

However, a laser crystallization process is included in the manufacture of low-temperature polysilicon in general, and thus, low-temperature polysilicon cannot be used for a large substrate. Since an expensive quartz substrate is used for the manufacture of high-temperature polysilicon, a technique of manufacturing thin film transistors having sufficiently high field effect mobility over an inexpensive glass substrate with a large area has not been established yet.

Thus, as one technique of manufacturing thin film transistors having sufficiently high field effect mobility over an inexpensive glass substrate, thin film transistors formed using microcrystalline silicon have been developed. Further, in recent years, thin film transistors formed using an oxide semiconductor have been developed (e.g., Patent Document 1 and Patent document 2). The use of an oxide semiconductor allows thin film transistors to obtain sufficient mobility, so that thin film transistors with high field effect mobility can be formed over an inexpensive glass substrate with a large area.

Some of the thin film transistors formed using the above semiconductor material would be unipolar transistors. Alternatively, even when both thin film transistors having p-type conductivity and thin film transistors having n-type conductivity can be formed, the number of manufacturing steps is remarkably increased because a p-channel thin film transistor and an n-channel thin film transistor are separately formed. Therefore, thin film transistors to be formed over the same substrate preferably have one conductivity. N-channel thin film transistors which have relatively high carrier mobility are particularly preferable.

[References]
[Patent Document 1] Japanese Published Patent Application No. 2007-123861
[Patent Document 2] Japanese Published Patent Application No. 2007-096055

DISCLOSURE OF INVENTION

However, for example, there is a problem in unipolar thin film transistors formed using the above oxide semiconductor are depletion (normally ON) transistors in many cases and it is difficult to provide a logic circuit which operates as appropriate in a driver circuit.

According to one embodiment of the present invention, it is an object to provide a circuit with a simpler structure, which can be operated without problems even when unipolar depletion transistors are used.

According to one embodiment of the present invention, it is an object to provide a display device provided with a circuit (e.g., driver circuit) which can operate without problems over an inexpensive glass substrate with a large area.

Further, according to one embodiment of the present invention, it is an object to reduce power consumption.

One embodiment of the present invention is a logic circuit including a source follower circuit and a logic circuit an input portion of which is connected to an output portion of the source follower circuit and all transistors of which are unipolar transistors. A potential of a wiring for supplying a low potential connected to the source follower circuit is lower than a potential of a wiring for supplying a low potential connected to the logic circuit.

One embodiment of the present invention is a logic circuit including a plurality of source follower circuits and an inverter circuit an input portion of which is connected to an output portion of the source follower circuit and all transistors of which are unipolar transistors. A potential of a wiring for supplying a low potential connected to the source follower circuit is lower than a potential of a wiring for supplying a low potential connected to the inverter circuit.

One embodiment of the present invention is a logic circuit including a plurality of source follower circuits and a NOR circuit an input portion of which is connected to an output portion of each of the plurality of source follower circuits and all transistors of which are unipolar transistors. A potential of wirings for supplying a low potential connected to the plurality of source follower circuits is lower than a potential of a wiring for supplying a low potential connected to the NOR circuit.

One embodiment of the present invention is a logic circuit including a plurality of source follower circuits and a NAND circuit an input portion of which is connected to an output portion of each of the plurality of source follower circuits and all transistors of which are unipolar transistors. A potential of wirings for supplying a low potential connected to the plurality of source follower circuits is lower than a potential of a wiring for supplying a low potential connected to the NAND circuit.

One embodiment of the present invention is a logic circuit including an input terminal, an output terminal, a first transistor, a second transistor, a third transistor, and a fourth transistor. One of a source and a drain of the first transistor is connected to a high potential wiring and a gate of the first transistor is connected to the input terminal. One of a source and a drain of the second transistor is connected to the other of the source and the drain of the first transistor, the other of the source and the drain of the second transistor is connected to a first low potential wiring, and a constant potential is supplied to a gate of the second transistor. One of a source and a drain of the third transistor is connected to a high potential wiring and a constant potential is supplied to a gate of the third transistor. One of a source and a drain of the fourth transistor is connected to the other of the source and the drain of the third transistor, the other of the source and the drain of the fourth transistor is connected to a second low potential wiring, and a gate of the fourth transistor is connected between the first transistor and the second transistor. The output terminal is connected between the third transistor and the fourth transistor. A potential of the first low potential wiring is lower than a potential of the second low potential wiring. Note that instead of this inverter circuit, a NOR circuit or a NAND circuit may be used.

In one embodiment of the present invention having the above structure, all the unipolar transistors are preferably formed using an oxide semiconductor, but not limited to the oxide semiconductor; for example, amorphous silicon and crystalline silicon may be used.

The logic circuit which is one embodiment of the present invention having the above structure can be applied to a driver circuit portion of a display device.

One preferable embodiment of a display device which is one embodiment of the present invention having the above structure is a liquid crystal display device or electronic paper.

Note that a transistor is an element having at least three terminals of a gate terminal, a drain terminal, and a source terminal, and has a channel formation region between a drain region and a source region. In the transistor, the potential of the gate terminal with respect to the potential of the source terminal is set to a given potential, so that current can flow between the drain region and the source region through the channel formation region. In this specification, a terminal connected to a wiring for supplying a high potential Vdd is referred to as a drain, and a terminal connected to a wiring for supplying a low potential Vss1 or a low potential Vss2 is referred to as a source.

Note that the high potential Vdd is a signal with a potential that is higher than a reference potential, and the low potential Vss1 and the low potential Vss2 are signals with a potential which is lower than or equal to the reference potential. Note that in description of the operation of a circuit, the high potential Vdd is the highest potential in the circuit, and the low potential Vss1 or the low potential Vss2 is the lowest potential in the circuit. Note that in a semiconductor device which includes the circuit, the high potential Vdd is not necessarily the highest potential, and the low potential Vss1 or the low potential Vss2 is not necessarily the lowest potential.

Note that the semiconductor device is referred to as a device which includes at least one transistor.

Note that the structure of a thin film transistor is not limited to a particular structure unless otherwise specifically stated. For example, a bottom-gate thin film transistor or a top-gate thin film transistor may be used. Alternatively, a coplanar thin film transistor or a staggered thin film transistor may be used.

Alternatively, a multi-gate structure having two or more gate electrodes may be used. Here, the gate electrodes may be disposed above and below a semiconductor layer so as to sandwich the semiconductor layer or may be disposed on the same layer without sandwiching the semiconductor layer, for example.

Note that when it is explicitly described that "A and B are connected", (1) the case where A and B are electrically connected, (2) the case where A and B are functionally connected, and (3) the case where A and B are directly connected are included therein. Here, each of A and B corresponds to a device, an element, a circuit, a wiring, an electrode, a terminal, a conductive film, or a layer. Therefore, in one embodiment of the present invention, the connection relationship is not limited to the one illustrated in drawings or described herein, and another connection relationship may be used. Accordingly, in one embodiment of the present invention, the connection relationship is not limited to the one illustrated in drawings and can be changed as appropriate within the range without departing from the spirit.

Note that a gate length L is the length between a source and a drain in a region where a gate and a semiconductor layer of a transistor overlap with each other.

Note that a scan line is a wiring (gate line) connected to the gate, and a signal line is a wiring (source wiring) connected to the source. The scan line can be formed using the same layer as the gate electrode, and the signal line can be formed using the same layer as the source electrode and the drain electrode.

According to one embodiment of the present invention, a circuit which can be operated without problems can be formed using a simple structure even when only unipolar depletion thin film transistors are used. Further, characteristics (e.g., threshold voltage) of thin film transistors provided in the circuit are not necessarily different from each other.

In addition, according to one embodiment of the present invention, a display device in which a circuit (e.g., driver circuit) which can be operated without problems is provided over an inexpensive glass substrate with a large area can be provided.

Further, according to one embodiment of the present invention, power consumption can also be reduced.

BRIEF DESCRIPTION OF DRAWINGS

FIGS. 8A, 8B, 8C1, and 8C2 are cross-sectional views of a given portion in the top view illustrated in FIG. 7.

BEST MODE FOR CARRYING OUT THE INVENTION

Figure 1A:
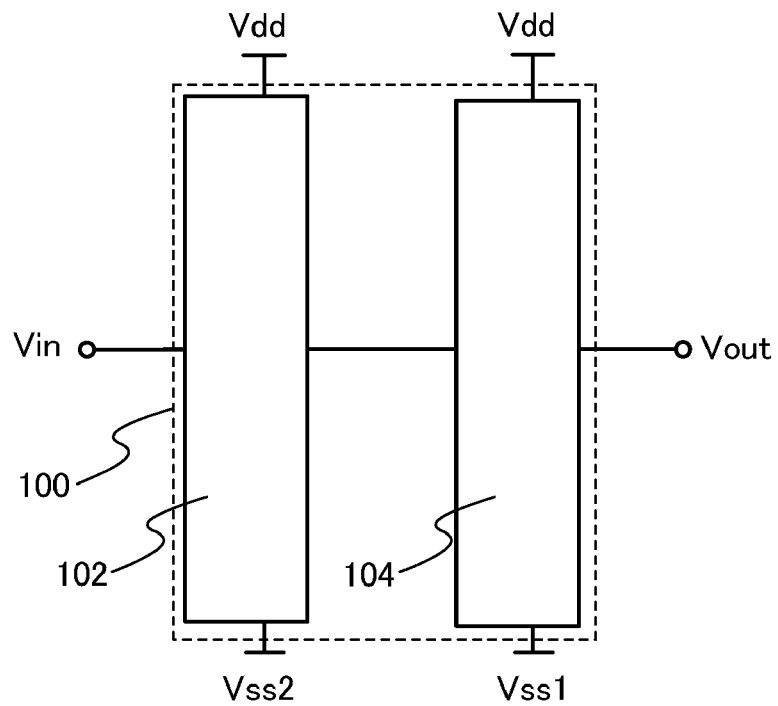
FIGS. 1A and 1B are diagrams illustrating a circuit which is one embodiment of the present invention.

Hereinafter, embodiments and example of the present invention are described with reference to the drawings. However, the present invention is not limited to the following description. It is easily understood by those skilled in the art that the mode and detail can be changed in various ways unless departing from the scope and spirit of the present invention. Therefore, unless such changes and modifications depart from the scope of the present invention, they should be construed as being included therein. In describing structures of the present invention with reference to the drawings, reference numerals denoting the same components are used in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

(Embodiment 1)

In this embodiment, a circuit which is one embodiment of the present invention will be described.

In FIG. 1A, an inverter circuit 100 (also referred to as a NOT circuit) which is one embodiment of the present invention is illustrated. As illustrated in FIG. 1A, the inverter circuit 100 includes a source follower circuit 102 connected to an input terminal (potential Vin) and an inverter circuit 104 connected to an output terminal (potential Vout). The source follower circuit 102 and the inverter circuit 104 are connected to each other.

Figure 1B:
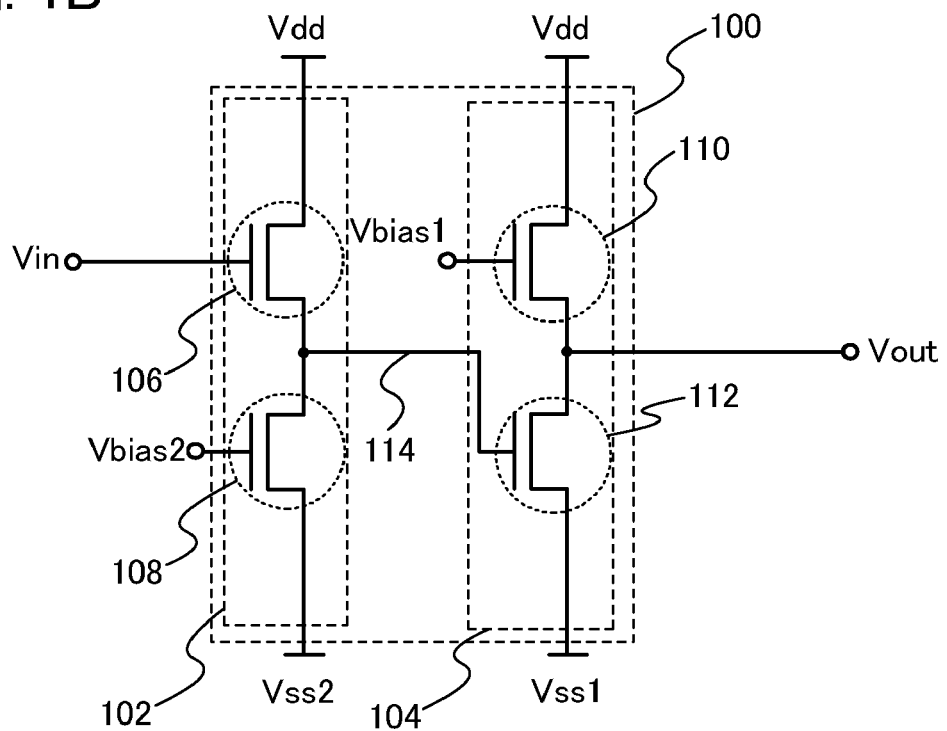

In FIG. 1B, an example of a specific circuit configuration of the inverter circuit 100 illustrated in FIG. 1A is illustrated.

In FIG. 1B, the source follower circuit 102 has a transistor 106 and a transistor 108. A gate of the transistor 106 is connected to the input terminal (potential Vin), a high potential Vdd is supplied to a drain of the transistor 106, and a source of the transistor 106 is connected to a drain of the transistor 108. A bias potential Vbias2 is supplied to a gate of the transistor 108, the drain of the transistor 108 is connected to the source of the transistor 106, and a low potential Vss2 is supplied to a source of the transistor 108. Note that a signal output from the source of the transistor 106 and the drain of the transistor 108 is input to the inverter circuit 104 through a node 114.

Note that a potential of the node 114 is referred to as Vbuf in the following description. That is, in the following description, Vbuf denotes a potential of an output signal of the source follower circuit 102.

Similarly, in FIG. 1B, the inverter circuit 104 has a transistor 110 and a transistor 112. A bias potential Vbias1 is supplied to a gate of the transistor 110, a high potential Vdd is supplied to a drain of the transistor 110, and a source of the transistor 110 is connected to a drain of the transistor 112. A signal output from the source follower circuit 102 is input to a gate of the transistor 112 through the node 114, and the drain of the transistor 112 is connected to the source of the transistor 110, and a low potential Vss1 is supplied to a source of the transistor 112.

Here, all of the transistor 106, the transistor 108, the transistor 110, and the transistor 112 are n-channel depletion transistors. However, one embodiment of the present invention is not limited to this, and all of these transistors may be p-channel depletion transistors.

Note that in the case where all of the transistors are p-channel depletion transistors, a side to which the high potential is supplied and a side to which the low potential is supplied in the circuit configuration in the case where all of the transistors are n-channel depletion transistors may be replaced with each other.

Note that in this embodiment, all of the transistors are described as depletion transistors unless otherwise specifically stated; however, one embodiment of the present invention is not limited to this and enhancement transistors can be used.

The inverter circuit 100 illustrated in FIGS. 1A and 1B is different from a conventional inverter circuit in that an input signal is input through the source follower circuit 102. One characteristic is that the low potential Vss2 of the source follower circuit 102 is different from the low potential Vss1 of the inverter circuit 104 and the low potential Vss2 is smaller than the low potential Vss1.

Note that in the case where all of the transistors are p-channel depletion transistors, the potential of the source follower circuit 102 on the high potential side may be different from the potential of the inverter circuit 104 on the high potential side, and the potentials on the low potential side may be a common potential.

Here, detailed operation of the inverter circuit 100 illustrated in FIG. 1B is described. Note that here, the case is described in which threshold voltages Vth of the transistor 106, the transistor 108, the transistor 110, and the transistor 112 are equal to each other for simple description. However, one embodiment of the present invention is not limited to this, and the threshold voltages Vth of the transistor 106, the transistor 108, the transistor 110, and the transistor 112 may be different from each other.

First, the case where Vin is sufficiently low and Vgs=Vin−Vss2<Vth is satisfied in the transistor 106 (in a range referred to as a first range in FIG. 2) will be described. Note that in the transistor 108, Vbias2 is set so as to satisfy Vgs=Vbias2−Vss2>Vth. At this time, the transistor 106 is turned off and the transistor 108 is turned on, so that Vbuf=Vss2 is satisfied. Then, the gate potential of the transistor 112 is Vss2, so that Vgs=Vss2−Vss1 is satisfied in the transistor 112. Here, since the transistor 112 needs to be turned off, Vss2−Vss1<Vth is set.

Next, in the case where Vin−Vss2>Vth is satisfied (in a range referred to as a second range in FIG. 2), the transistor 106 is turned on and Vbuf>Vss2 is satisfied.

Figure 2:
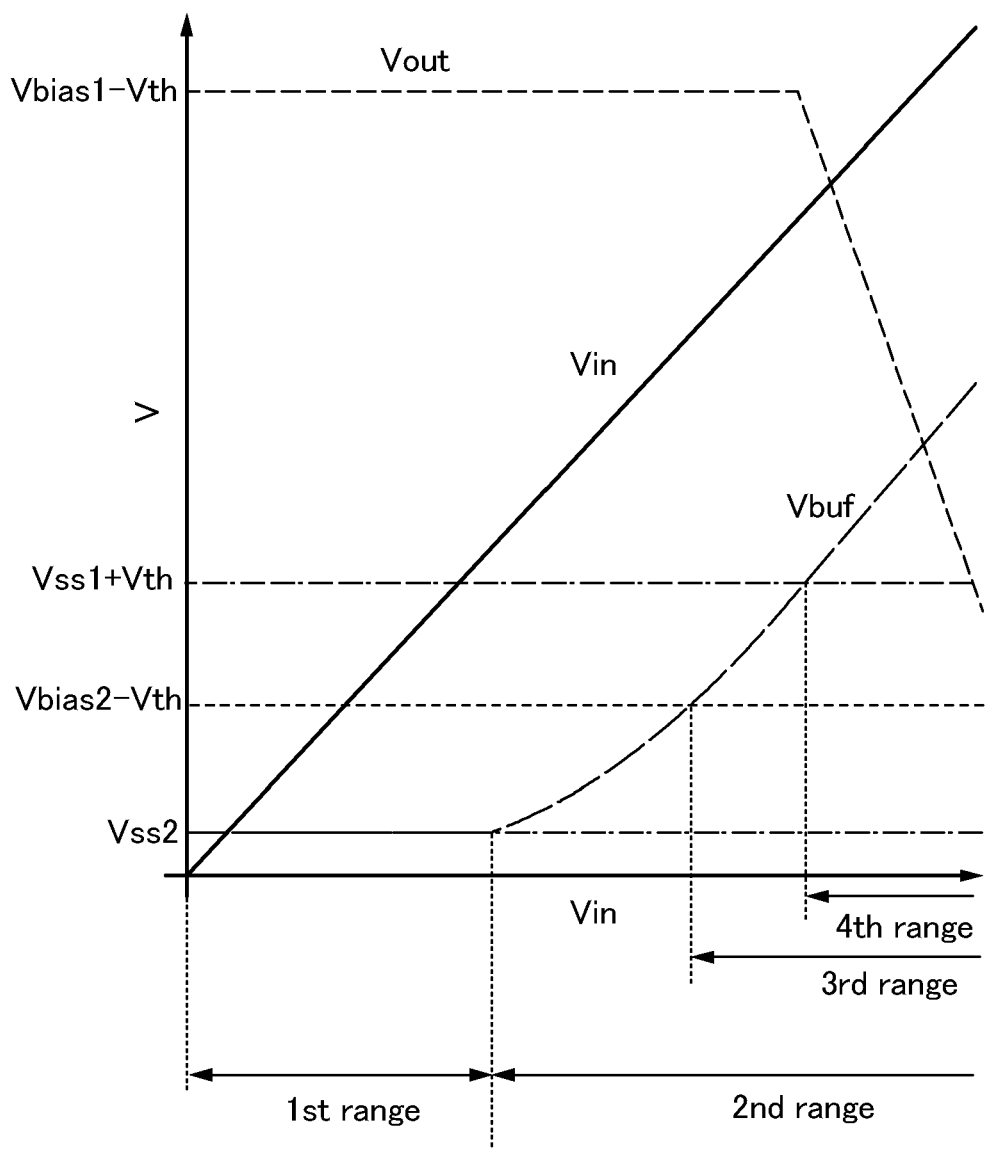
FIG. 2 is a graph showing an example of operation of the circuit illustrated in FIGS. 1A and 1B.

Next, in the case where Vbuf>Vbias2−Vth is satisfied (in a range referred to as a third range in FIG. 2), the transistor 108 operates in a saturation region and Vin−Vbuf is set to be constant. This is illustrated in FIG. 2 where a straight line which shows Vin is in parallel with a straight line which shows Vbuf.

Lastly, the case where Vin is sufficiently high and Vbuf>Vss1+Vth is satisfied (in a range referred to as a fourth range in FIG. 2) is described. At this time, Vgs(=Vbuf−Vss1)>Vth is satisfied in the transistor 112, and thus the transistor 112 is turned on.

Here, at least in the region where the transistor 112 provided in the inverter circuit 104 is turned on, Vin−Vbuf is set to be constant. Therefore, as is apparent from FIG. 2, Vbias2−Vth<Vss1+Vth is satisfied. Vbias2−Vss2>Vth may be satisfied in order to turn on the transistor 108 of the source follower circuit 102. Therefore, it is necessary to satisfy Vss2+Vth<Vbias2<Vss1+2Vth.

At this time, when the transistor 108 of the source follower circuit 102 is turned on, Vin−Vbuf=Vth+k (Vbias2−Vss2−Vth) is satisfied. Here, k is a coefficient determined by the size of the transistor, or the like. When k is 1 for simplicity, Vin−Vbuf=Vbias2−Vss2 is satisfied. Therefore, Vin−Vbuf can be controlled by controlling one of or both Vbias2 and Vss2. Vbias2 is difficult to adjust because Vss2+Vth<Vbias2<Vss1+2Vth should be satisfied; therefore, Vss2 may be adjusted.

A method for compensating a change of the threshold is described. For example, when the threshold shifts to a negative potential side, Vin−Vbuf may be increased by the amount of the shift; therefore, one of or both Vbias2 and Vss2 may be controlled so as to satisfy −ΔVth=Δ (Vbias2−Vss2)=ΔVbias2−ΔVss2.

As described above, the inverter circuit 100 can be operated. That is, when a high potential signal is input from the input terminal (potential Vin), a circuit in which a low potential signal is output from the output terminal (potential Vout) can be obtained.

Note that the inverter circuit which is one embodiment of the present invention is not limited to the structure illustrated in FIGS. 1A and 1B, and another circuit configuration may be used as appropriate.

Note that the circuit which is one embodiment of the present invention is not limited to the inverter circuit (NOT circuit), and for example, a NAND circuit or a NOR circuit may be used.

Figure 3:
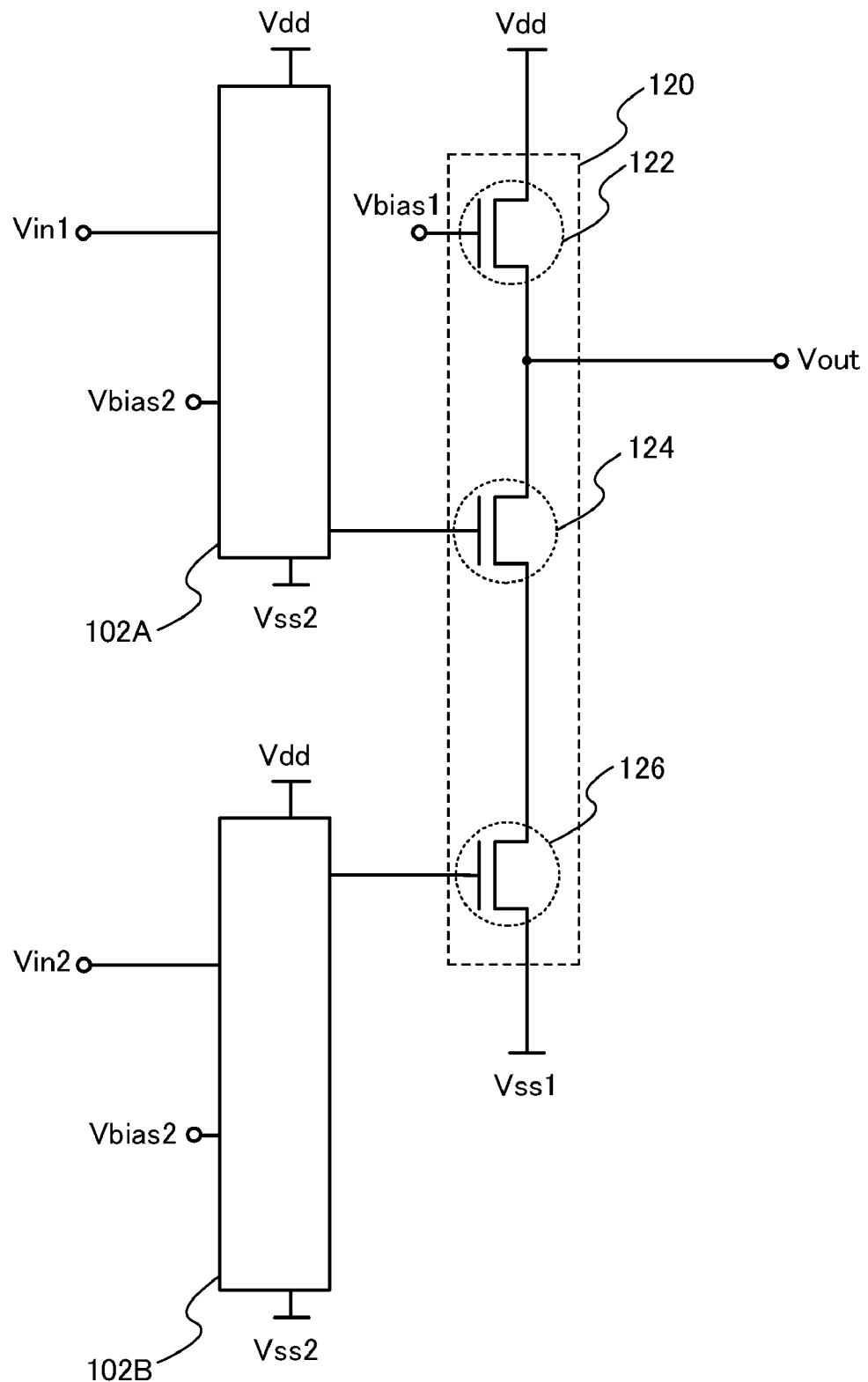
FIG. 3 is a diagram illustrating a circuit which is one embodiment of the present invention.

A NAND circuit having two input terminals, which is one embodiment of the present invention, is illustrated in FIG. 3. The NAND circuit illustrated in FIG. 3 has a first source follower circuit 102A connected to a first input terminal (potential Vin1), a second source follower circuit 102B connected to a second input terminal (potential Vin2), and a NAND circuit 120 connected to an output terminal The first source follower circuit 102A and the second source follower circuit 102B are connected to the NAND circuit 120 so that signals are output to the NAND circuit 120 from the first source follower circuit 102A and the second source follower circuit 102B. Note that the first source follower circuit 102A and the second source follower circuit 102B may each have a structure similar to that of the source follower circuit 102 illustrated in FIGS. 1A and 1B.

In FIG. 3, an example of a specific circuit configuration of the NAND circuit 120 is illustrated. The NAND circuit 120 has a transistor 122, a transistor 124, and a transistor 126. The bias potential Vbias1 is supplied to a gate of the transistor 122, the high potential Vdd is supplied to a drain of the transistor 122, and a source of the transistor 122 is connected to a drain of the transistor 124. A signal output from the first source follower circuit 102A is input to a gate of the transistor 124, the drain of the transistor 124 is connected to the source of the transistor 122, and a source of the transistor 124 is connected to a drain of the transistor 126. A signal output from the second source follower circuit 102B is input to a gate of the transistor 126, the drain of the transistor 126 is connected to the source of the transistor 124, and the low potential Vss1 is supplied to a source of the transistor 126. That is, the transistor 122, the transistor 124, and the transistor 126 are connected in series.

Note that the source of the transistor 122 and the drain of the transistor 124 are connected to the output terminal (potential Vout).

The NAND circuit illustrated in FIG. 3 can be operated as shown in Table 1. That is, a circuit can be obtained in which a low potential signal (L) is output from the output terminal (potential Vout) only when high potential signals (H) are input from both the first input terminal (potential Vin1) and the second input terminal (potential Vin2).

TABLE 1

| first input terminal (Vin1) | second input terminal (Vin2) | output terminal (Vout) |
|---|---|---|
| H | H | L |
| H | L | H |
| L | H | H |
| L | L | H |

Figure 4:
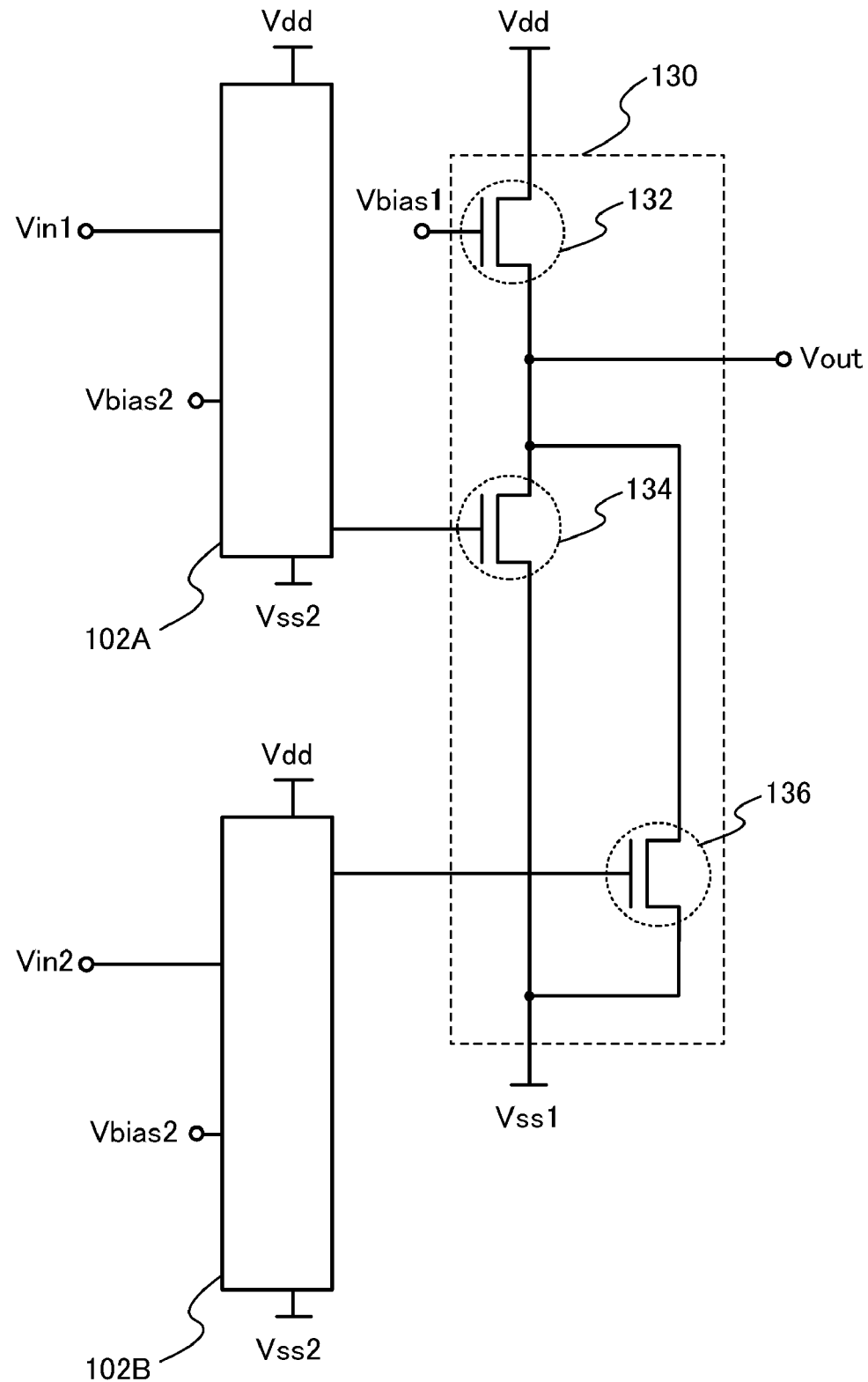
FIG. 4 is a diagram illustrating a circuit which is one embodiment of the present invention.

A NOR circuit having two input terminals, which is one embodiment of the present invention, is illustrated in FIG. 4. The NOR circuit illustrated in FIG. 4 has the first source follower circuit 102A connected to a first input terminal (potential Vin1), the second source follower circuit 102B connected to a second input terminal (potential Vin2), and a NOR circuit 130 connected to an output terminal. The first source follower circuit 102A and the second source follower circuit 102B are connected to the NOR circuit 130 so that signals are output to the NOR circuit 130 from the first source follower circuit 102A and the second source follower circuit 102B. Note that in a manner similar to that in FIG. 3, the first source follower circuit 102A and the second source follower circuit 102B may each have a structure similar to that of the source follower circuit 102 illustrated in FIGS. 1A and 1B.

In FIG. 4, an example of a specific circuit configuration of the NOR circuit 130 is illustrated. The NOR circuit 130 has a transistor 132, a transistor 134, and a transistor 136. The bias potential Vbias1 is supplied to a gate of the transistor 132, the high potential Vdd is supplied to a drain of the transistor 132, and a source of the transistor 132 is connected to a drain of the transistor 134 and a drain of the transistor 136. A signal output from the first source follower circuit 102A is input to a gate of the transistor 134, the drain of the transistor 134 is connected to the source of the transistor 132, and the low potential Vss1 is supplied to a source of the transistor 134. A signal output from the second source follower circuit 102B is input to a gate of the transistor 136, the drain of the transistor 136 is connected to the source of the transistor 132, and the low potential Vss1 is supplied to a source of the transistor 136. That is, the transistor 134 and the transistor 136 are connected in parallel, and these transistors and the transistor 132 are connected in series.

Note that the source of the transistor 132, the drain of the transistor 134, and the drain of the transistor 136 are connected to the output terminal (potential Vout).

The NAND circuit illustrated in FIG. 4 can be operated as shown in Table 2. That is, a circuit can be obtained in which a high potential signal (H) is output from the output terminal (potential Vout) only when low potential signals (L) are input from both the first input terminal (potential Vin1) and the second input terminal (potential Vin2).

TABLE 2

| first input terminal (Vin1) | second input terminal (Vin2) | output terminal (Vout) |
|---|---|---|
| H | H | L |
| H | L | L |
| L | H | L |
| L | L | H |

Figure 5:
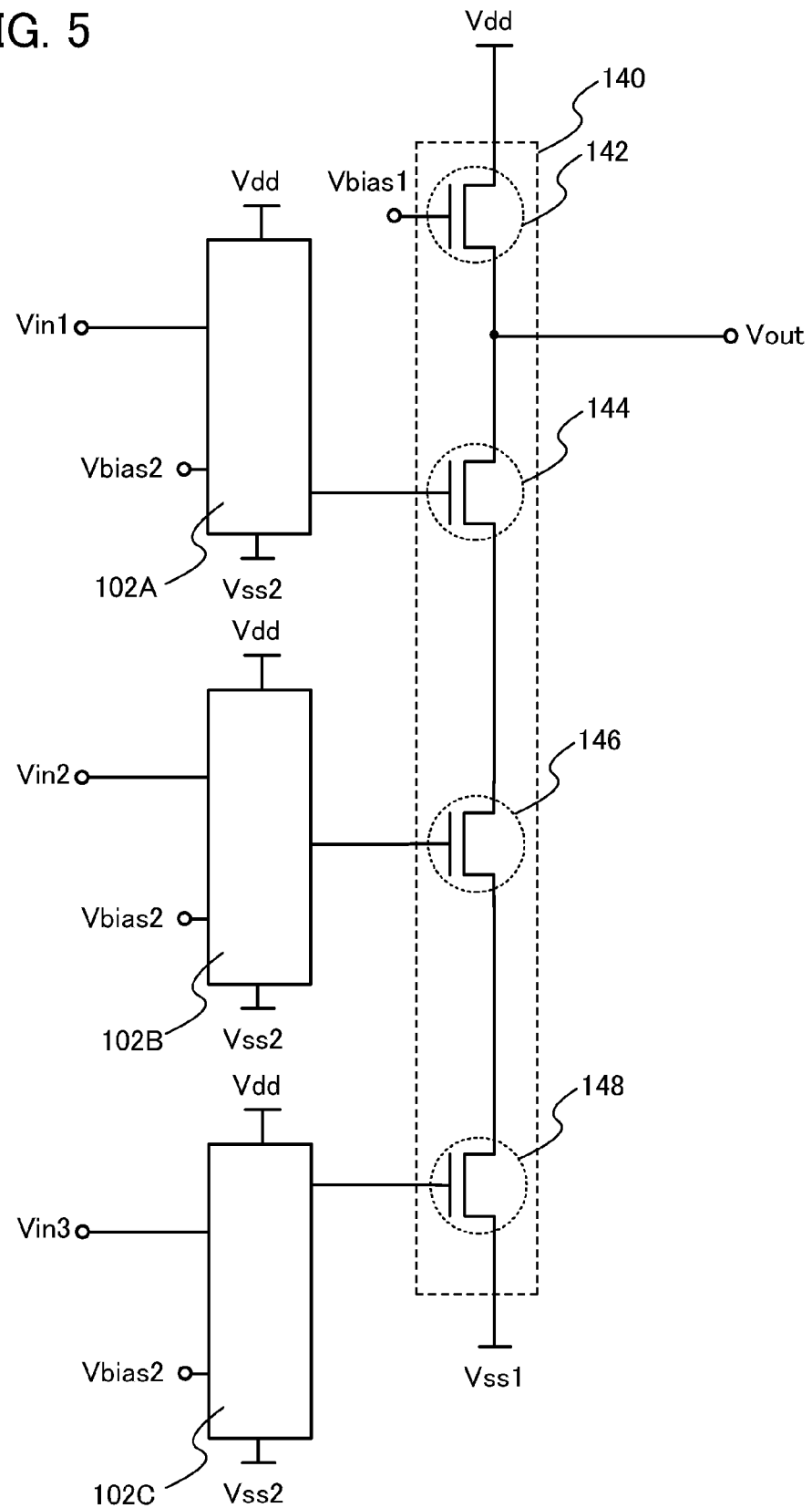
FIG. 5 is a diagram illustrating a circuit which is one embodiment of the present invention.

A NAND circuit having three input terminals, which is one embodiment of the present invention, is illustrated in FIG. 5. The NAND circuit illustrated in FIG. 5 has the first source follower circuit 102A connected to a first input terminal (potential Vin1), the second source follower circuit 102B connected to a second input terminal (potential Vin2), a third source follower circuit 102C connected to a third input terminal (potential Vin3), and a NAND circuit 140 connected to an output terminal The first source follower circuit 102A, the second source follower circuit 102B, and the third source follower circuit 102C are connected to the NAND circuit 140 so that signals are output to the NAND circuit 140 from the first source follower circuit 102A, the second source follower circuit 102B, and the third source follower circuit 102C. Note that the first source follower circuit 102A, the second source follower circuit 102B, and the third source follower circuit 102C may each have a structure similar to that of the source follower circuit 102 illustrated in FIGS. 1A and 1B.

In FIG. 5, an example of a specific circuit configuration of the NAND circuit 140 is illustrated. The NAND circuit 140 has a transistor 142, a transistor 144, a transistor 146, and a transistor 148. The bias potential Vbias1 is supplied to a gate of the transistor 142, the high potential Vdd is supplied to a drain of the transistor 142, and a source of the transistor 142 is connected to a drain of the transistor 144. A signal output from the first source follower circuit 102A is input to a gate of the transistor 144, the drain of the transistor 144 is connected to the source of the transistor 142, and a source of the transistor 144 is connected to a drain of the transistor 146. A signal output from the second source follower circuit 102B is input to a gate of the transistor 146, the drain of the transistor 146 is connected to the source of the transistor 144, and a source of the transistor 146 is connected to a drain of the transistor 148. A signal output from the third source follower circuit 102C is input to a gate of the transistor 148, the drain of the transistor 148 is connected to the source of the transistor 146, and the low potential Vss1 is supplied to a source of the transistor 148. That is, the transistor 142, the transistor 144, the transistor 146, and the transistor 148 are connected in series.

Note that the source of the transistor 142 and the drain of the transistor 144 are connected to the output terminal (potential Vout).

The NAND circuit illustrated in FIG. 5 can be operated as shown in Table 3. That is, a circuit can be obtained in which a low potential signal (L) is output from the output terminal (potential Vout) only when high potential signals (H) are input from all of the first input terminal (potential Vin1), the second input terminal (potential Vin2), and the third input terminal (potential Vin3).

TABLE 3

| first input terminal (Vin1) | second input terminal (Vin2) | third input terminal (Vin3) | output terminal (Vout) |
|---|---|---|---|
| H | H | H | L |
| L | H | H | H |
| H | L | H | H |
| H | H | L | H |
| H | L | L | H |
| L | H | L | H |
| L | L | H | H |
| L | L | L | H |

Figure 6:
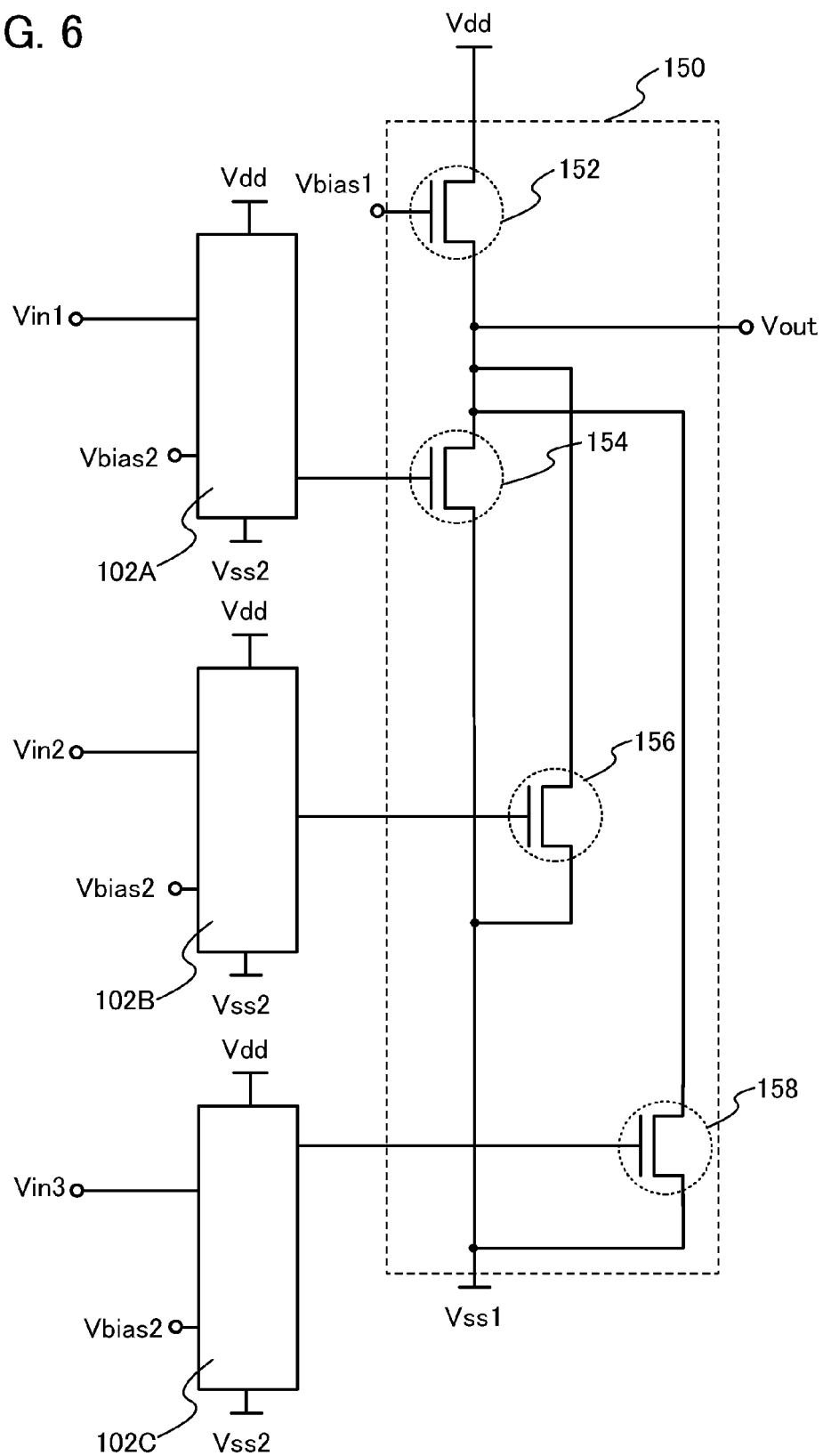
FIG. 6 is a diagram illustrating a circuit which is one embodiment of the present invention.

A NOR circuit having three input terminals, which is one embodiment of the present invention, is illustrated in FIG. 6. The NOR circuit illustrated in FIG. 6 has the first source follower circuit 102A connected to a first input terminal (potential Vin1), the second source follower circuit 102B connected to a second input terminal (potential Vin2), the third source follower circuit 102C connected to the third input terminal (potential Vin3), and a NOR circuit 150 connected to an output terminal The first source follower circuit 102A, the second source follower circuit 102B, and the third source follower circuit 102C are connected to the NOR circuit 150 so that signals are output to the NOR circuit 150 from the first source follower circuit 102A, the second source follower circuit 102B, and the third source follower circuit 102C. Note that the first source follower circuit 102A, the second source follower circuit 102B, and the third source follower circuit 102C may each have a structure similar to that of the source follower circuit 102 illustrated in FIGS. 1A and 1B.

In FIG. 6, an example of a specific circuit configuration of the NOR circuit 150 is illustrated. The NOR circuit 150 has a transistor 152, a transistor 154, a transistor 156, and a transistor 158. The bias potential Vbias1 is supplied to a gate of the transistor 152, the high potential Vdd is supplied to a drain of the transistor 152, and a source of the transistor 152 is connected to a drain of the transistor 154, a drain of the transistor 156, and a drain of the transistor 158. A signal output from the first source follower circuit 102A is input to a gate of the transistor 154, the drain of the transistor 154 is connected to the source of the transistor 152, and the low potential Vss1 is supplied to a source of the transistor 154. A signal output from the second source follower circuit 102B is input to a gate of the transistor 156, the drain of the transistor 156 is connected to the source of the transistor 152, and the low potential Vss1 is supplied to a source of the transistor 156. A signal output from the third source follower circuit 102C is input to a gate of the transistor 158, the drain of the transistor 158 is connected to the source of the transistor 152, and the low potential Vss1 is supplied to a source of the transistor 158. That is, the transistor 154, the transistor 156, and the transistor 158 are connected in parallel, and these transistors and the transistor 152 are connected in series.

Note that the source of the transistor 152, the drain of the transistor 154, the drain of the transistor 156, and the drain of the transistor 158 are connected to the output terminal (potential Vout).

The NAND circuit illustrated in FIG. 6 can be operated as shown in Table 4. That is, a circuit can be obtained in which a high potential signal (H) is output from the output terminal (Vout) only when low potential signals (L) are input from all of the first input terminal (potential Vin1), the second input terminal (potential Vin2), and the third input terminal (potential Vin3).

TABLE 4

| first input terminal (Vin1) | second input terminal (Vin2) | third input terminal (Vin3) | output terminal (Vout) |
|---|---|---|---|
| H | H | H | L |
| L | H | H | L |
| H | L | H | L |
| H | H | L | L |
| H | L | L | L |
| L | H | L | L |
| L | L | H | L |
| L | L | L | H |

As is described with reference to FIG. 3, FIG. 4, FIG. 5, and FIG. 6, the circuit which is one embodiment of the present invention is not limited to an inverter circuit, and may be a NAND circuit or a NOR circuit. Further, the circuit configuration is not limited to the structure illustrated in the drawings and can be applied to various circuits which operate in a similar manner.

Note that in the above structure of one embodiment of the present invention, the transistor is not limited to a particular structure. For example, there are a thin film transistor, a field effect transistor, and the like; however, one embodiment of the present invention is not limited to these.

According to this embodiment, a circuit which can be operated without problems can be formed using a simple structure even when only unipolar depletion transistors are used. Further, characteristics (e.g., threshold voltage) of thin film transistors provided in the circuit are not necessarily different from each other. Such a circuit can be applied to a driver circuit provided in a display device, for example. Further, according to one embodiment of the present invention, power consumption can also be reduced.

The circuit described in this embodiment, which is one embodiment of the present invention, is particularly effective in the case where the gate length L is short.

This is because the transistor is easy to become a depletion transistor when the gate length L is short. For example, a transistor including an oxide semiconductor tends to become a depletion transistor when $L<10$ µm is satisfied. When the gate length L is reduced, current which flows between a source and a drain can be increased. Therefore, current which flows between the source and the drain can be increased and a circuit having the above effect can be obtained.

This embodiment can be implemented in appropriate combination with the structures described in any of the other embodiments.

(Embodiment 2)

In this embodiment, a thin film transistor in which a semiconductor layer is formed using an oxide semiconductor will be described as one particularly preferable embodiment of a transistor which can be applied to the circuit described in Embodiment 1. In addition, an example of a display device having a circuit provided with the transistor will be described.

Figure 7:
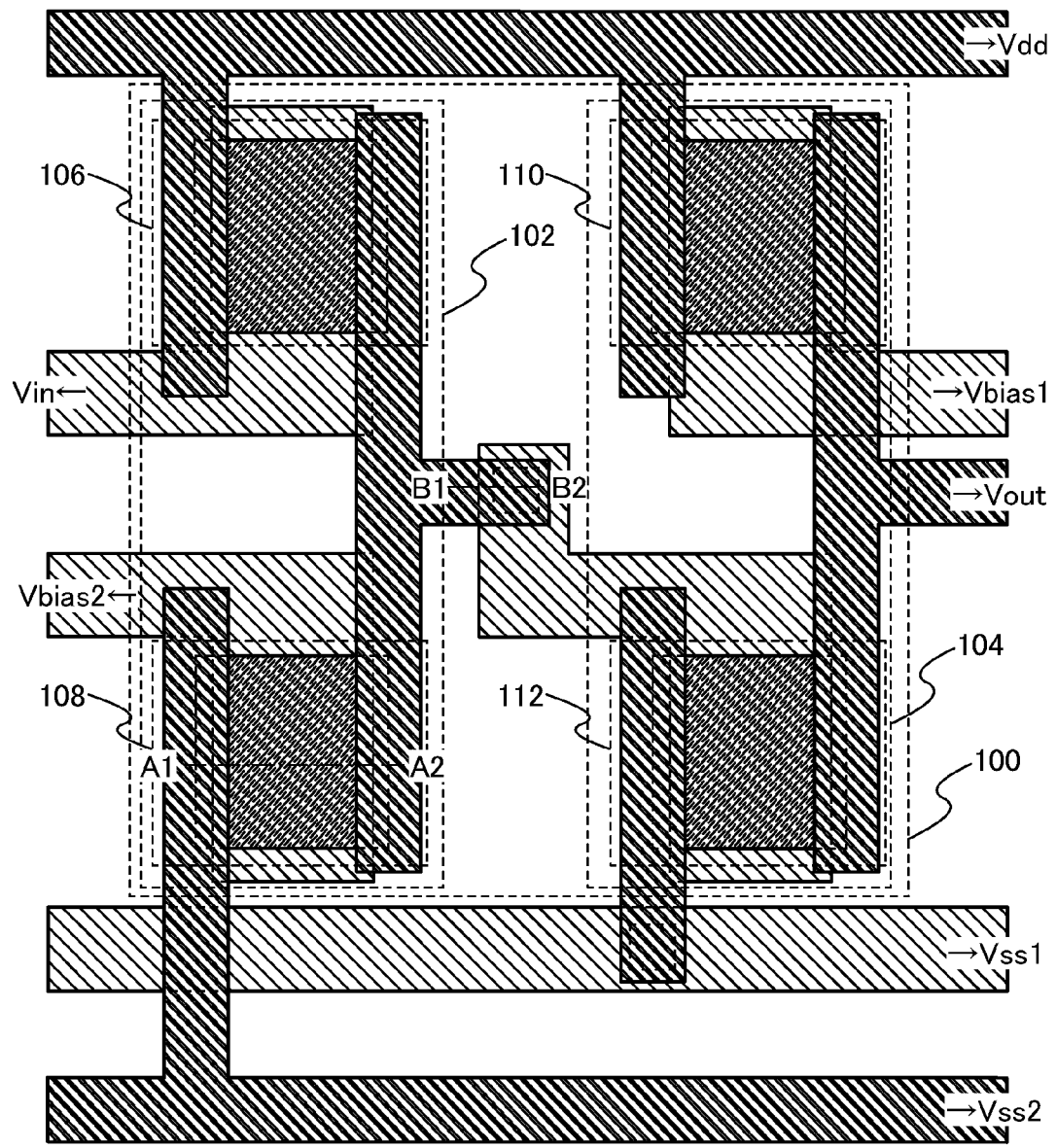
FIG. 7 is a top view illustrating one embodiment of an element structure to which the circuit illustrated in FIGS. 1A and 1B is applied.

FIG. 7 is a top view of the inverter circuit 100. That is, FIG. 7 is a top view of the source follower circuit 102 having the transistor 106 and the transistor 108 and the inverter circuit 104 having the transistor 110 and the transistor 112.

Figure 8A:
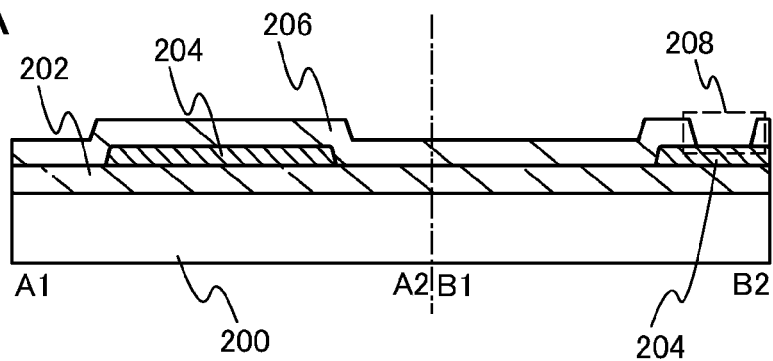

FIGS. 8A, 8B, 8C1, and 8C2 illustrate an example of a manufacturing process of the inverter circuit 100 illustrated in FIG. 7. Note that FIGS. 8C1 and 8C2 are cross-sectional views of the inverter circuit 100 illustrated in FIG. 7 taken along lines A1-A2 and B1-B2.

First, a base film 202 is formed over a substrate 200. Next, a first electrode layer 204 is formed over the base film 202.

As the substrate 200, for example, a glass substrate can be used. As a material of the glass substrate, a glass material such as aluminosilicate glass, aluminoborosilicate glass, or barium borosilicate glass is used, for example.

The base film 202 has a function of preventing diffusion of an impurity element from the substrate 200, and can be formed to have a single-layer or stacked structure including one or more of a silicon nitride film, a silicon oxide film, a silicon nitride oxide film, and a silicon oxynitride film. The base film 202 preferably contains nitrogen.

The first electrode layer 204 forms at least a gate electrode and a capacitor electrode. There is no particular limitation on a material for forming the first electrode layer 204, and a material having conductivity may be used. For example, aluminum, chromium, tantalum, titanium, molybdenum, or tungsten; an alloy containing any of these as its main component; and an alloy containing two or more of these as its main components can be given. For example, a conductive film formed with a sputtering method or the like is processed with a photolithography method, so that the first electrode layer 204 can be formed. Alternatively, an ink-jet method may be used. The first electrode layer 204 may have a single-layer structure or a stacked structure including a plurality of layers.

Next, a first insulating layer 206 is formed so as to cover the first electrode layer 204.

The first insulating layer 206 functions as at least a gate insulating layer of a thin film transistor and a dielectric layer of a capacitor. There is no particular limitation on the material used for forming the first insulating layer 206, and an insulating material may be used. For example, the first insulating layer 206 can be formed using a single-layer structure or a stacked structure including any of a silicon oxide layer, a silicon nitride layer, a silicon oxynitride layer, and a silicon nitride oxide layer. The first insulating layer 206 can be formed with a plasma enhanced CVD method, a sputtering method, or the like, for example. As an example, monosilane, oxygen, and nitrogen are introduced into a chamber, and a silicon oxynitride layer can be formed with a plasma enhanced CVD method.

Next, for example, part of the first insulating layer 206 is selectively etched with a photolithography method, and an opening 208 is formed so as to expose the first electrode layer 204.

Note that the opening 208 is not necessarily provided at this stage, and the first electrode layer 204 and a second electrode layer 214 may be connected to each other using a third conductive layer to be formed later.

Figure 8B:
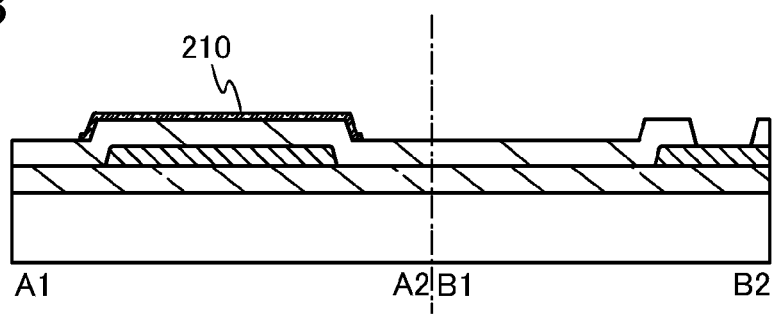
Figure 8B:
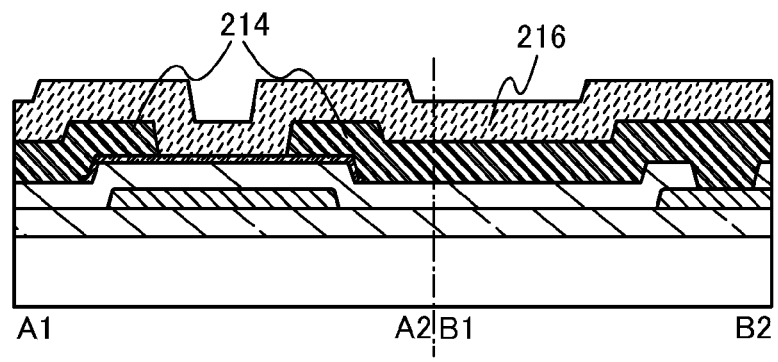
Figure 8B:
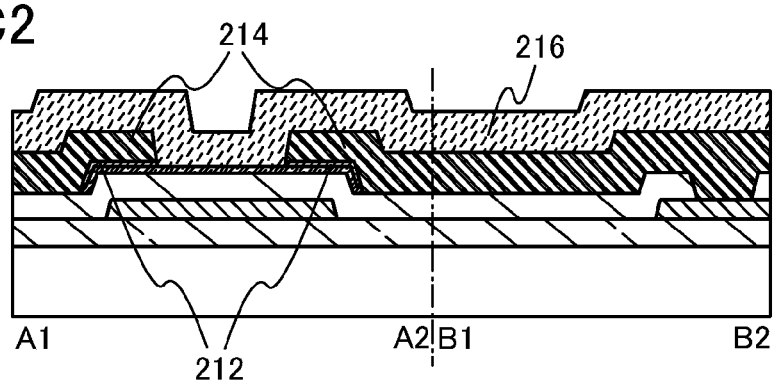

Next, over the first insulating layer 206, an oxide semiconductor layer 210 is formed (see FIG. 8B). The oxide semiconductor layer 210 may be formed in such a manner that an oxide semiconductor film is formed and processed into an island shape with a photolithography method. The thickness of the oxide semiconductor film may be 5 nm to 200 nm. When a semiconductor film formed using an oxide semiconductor has an amorphous structure, the thickness of the oxide semiconductor film is preferably less than or equal to 50 nm. The thickness of the oxide semiconductor film is less than or equal to 50 nm, so that an amorphous state of the oxide semiconductor film can be kept even when heat treatment for dehydration or dehydrogenation to be described below is performed after the oxide semiconductor film is formed.

Nota that as the oxide semiconductor film, a thin film expressed by $InMO_3(ZnO)_m$ (m>0, where m is not an integer) can be used. Here, M represents one or more metal elements selected from Ga, Fe, Ni, Mn, or Co. For example, M may be Ga, Ga and Ni, Ga and Fe, or the like. The oxide semiconductor film may contain a transition metal element or oxide of the transition metal element as an impurity element in addition to the metal element contained as M. In this specification, among oxide semiconductor films having a composition formula expressed by $InMO_3(ZnO)_m$ (m>0, where m is not an integer), an oxide semiconductor that contains Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As the oxide semiconductor film, any of the following oxide semiconductor films can be applied in addition to the In—Ga—Zn—O-based oxide semiconductor film: an In—Sn—O-based oxide semiconductor film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; an Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. In addition, the oxide semiconductor film can be formed with a sputtering method using one of or both a noble gas (e.g., argon) and an oxygen gas.

Here, sputtering is preferably performed under the condition that an oxide semiconductor target containing In, Ga, and Zn ($In_2O_3$:$Ga_2O_3$:ZnO=1:1:1 [mol %], In:Ga:Zn=1:1:0.5 [atomic %]) is used, the distance between the substrate and the target is set at 100 mm, the pressure is set at 0.6 Pa, the direct current (DC) power supply is set at 0.5 kW, and the atmosphere is an oxygen atmosphere (of an oxygen flow rate of 100%). Alternatively, sputtering may be performed under the condition that the distance between the substrate and the target is set at 170 mm, the pressure is set at 0.4 Pa, and the direct current (DC) power supply is set at 0.5 kW, and the atmosphere is an oxygen atmosphere (of an oxygen flow rate of 100%). Note that here, when a pulse DC power supply is used, generation of dust can be suppressed, so that uniformity of film thickness is also improved, which is particularly preferable.

As a sputtering method, there are the following methods: a radio frequency (RF) sputtering method in which a high-frequency power supply is used for a sputtering power supply, and a DC sputtering method in which a direct current power supply is used for a sputtering power supply. Further, there is a pulse DC sputtering method in which a pulse bias is applied. The RF sputtering method is preferably used for forming an insulating film, while the DC sputtering method and the pulse DC sputtering method are preferably used for forming a metal conductive film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber. The oxide semiconductor film in this embodiment may be formed using a multi-source sputtering apparatus.

In addition, there are a magnetron sputtering method which is performed using an apparatus provided with a magnet assembly in a chamber, and an electron current resonance (ECR) sputtering method using plasma which is generated not using glow discharge but using a microwave. The oxide semiconductor film in this embodiment may be formed using any of these sputtering apparatus.

In addition, there are also a reactive sputtering method in which a target substance and a sputtering gas component are chemically reacted with each other in film formation to form a thin film of a compound thereof, and a bias sputtering method in which voltage is also applied to a substrate side in film formation. The oxide semiconductor film in this embodiment may be formed using any of these sputtering methods.

Note that before the oxide semiconductor film is formed by a sputtering method, dust on a surface of the first insulating layer 206 is preferably removed by reverse sputtering in which an argon gas is introduced and plasma is generated. Here, the reverse sputtering is a method in which voltage is applied to the substrate side, not to a target side, in an argon atmosphere by using an RF power supply and plasma is generated and a substrate surface is exposed to the plasma, so that the substrate surface is modified. However, the surface is not necessarily modified. Note that a nitrogen atmosphere, a helium atmosphere, an oxygen atmosphere, or the like may be used instead of an argon atmosphere.

Note that a resist mask for forming the island-shaped oxide semiconductor layer 210 may be formed with an ink-jet method.

Next, dehydration or dehydrogenation of the oxide semiconductor layer 210 may be performed. Dehydration or dehydrogenation may be performed by heat treatment. Here, the heat treatment is performed at higher than or equal to 400° C. and lower than or equal to 750° C., preferably, higher than or equal to 425° C. and lower than a strain point of the substrate. Note that the heat treatment may be performed for less than or equal to one hour when the temperature is higher than or equal to 425° C., and the heat treatment may be performed for longer than one hour when the temperature is lower than 425° C. Here, after the substrate is put in an electric furnace which is a kind of heat treatment apparatus and heat treatment is performed on the oxide semiconductor layer in a nitrogen atmosphere, water or hydrogen is prevented from being mixed into the oxide semiconductor layer by preventing the oxide semiconductor layer from being exposed to the air; thus, the oxide semiconductor layer 210 is obtained. Here, an electric furnace is used up to the time when the temperature is lowered from the heat temperature T at which the dehydration or dehydrogenation of the oxide semiconductor layer is performed to the temperature enough to prevent entrance of water. Specifically, slow cooling is preferably performed in a nitrogen atmosphere up to the time when the heat temperature T is less than 100° C. Note that heat treatment for dehydration or dehydrogenation is preferably performed in a nitrogen atmosphere; however, one embodiment of the present invention is not limited to this, dehydration or dehydrogenation may be performed in a helium atmosphere, a neon atmosphere, or an argon atmosphere. At this time, it is particularly preferable that dehydration or dehydrogenation be performed in a nitrogen atmosphere in which $H_2O$ is less than or equal to 20 ppm, or in an ultra dry air in which $H_2O$ is less than or equal to 20 ppm. Here, the ultra dry air is an air in which a dew point is lower than or equal to −40° C., preferably, lower than or equal to −60° C. Note that the degree of crystallization of the oxide semiconductor layer is greater than or equal to 90% or greater than or equal to 80% under some heat conditions.

The heat treatment apparatus which can be used here is not limited to an electric furnace and may be provided with a device that heats an object to be processed by thermal conduction or thermal radiation from a heater such as a resistance heater or the like. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus which can heat an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus in which heat treatment is performed using a high-temperature gas. A gas used here may be an inert gas (noble gas such as argon or nitrogen) which does not react with an object to be processed by heat treatment.

It is preferable that the heat treatment for dehydration or dehydrogenation here be performed on the oxide semiconductor layer 210 which has been subjected to dehydration or dehydrogenation to the extent that two peaks caused by elimination of $H_2O$ are not detected even when measurement is performed by a thermal desorption spectroscopy (TDS) to 450° C. Note that it is preferable that at least the first peak that appears in the vicinity of 300° C. be set so as not to be detected.

Note that the dehydrogenation is not limited to the case where hydrogen is eliminated in the form of $H_2$, and generally refers to the case where hydrogen is eliminated in any form including at least hydrogen.

Cooling to be performed after the heat treatment for dehydration or dehydrogenation is preferably performed without exposure to the air. This is because water or hydrogen is prevented from being mixed into the oxide semiconductor layer. Therefore, cooling is preferably performed in the furnace in which the heat treatment is performed.

Note that the cooling may be performed in an atmosphere which is the same as or different from the atmosphere at the time of heat treatment. For example, an oxygen gas, a dinitrogen monoxide gas, or an ultra dry air can be used, and $H_2O$ is preferably less than or equal to 20 ppm.

The second electrode layer 214 is formed over the first insulating layer 206 and the oxide semiconductor layer 210. The second electrode layer 214 forms at least a source electrode and a drain electrode. There is no particular limitation on a material for forming the second electrode layer 214, and a material having conductivity may be used. For example, aluminum, chromium, tantalum, titanium, molybdenum, tungsten, or copper; an alloy containing any of these as its main component; and an alloy containing two or more of these as its main component can be given. For example, a conductive film formed with a sputtering method or the like is processed with a photolithography method, so that the second electrode layer 214 can be formed. Alternatively, an ink-jet method may be used. The second electrode layer 214 may have a single-layer structure or a stacked structure including a plurality of layers.

Note that in FIGS. 8A, 8B, 8C1, and 8C2, at least the conductive film which is on and in contact with the oxide semiconductor layer 210 may be removed selectively. That is, the etch rate of the conductive film to the oxide semiconductor layer is preferably high. For example, the conductive film on the oxide semiconductor layer is removed selectively by wet etching with the use of an ammonia peroxide mixture (hydrogen peroxide:ammonia water:water=5:2:2) or the like as an alkaline etchant, so that the oxide semiconductor layer can remain.

Note that between the oxide semiconductor layer 210 and the second electrode layer 214, an oxide conductive layer 212 may be provided. The conductivity of the oxide conductive layer 212 is higher than the conductivity of the oxide semiconductor layer 210 and lower than the conductivity of the second electrode layer 214. It is preferable that the oxide conductive layer 212 be formed with one including zinc oxide but not including indium oxide. For example, zinc oxide, zinc aluminum oxide, zinc aluminum oxynitride, gallium zinc oxide, or the like can be used. The oxide conductive layer 212 is referred to as a low-resistance drain (LRD, also referred to as an LRN (low-resistance n-type conductivity)) region. Specifically, the carrier concentration of the region is higher than that of the high-resistance drain region and preferably higher than or equal to $1\times10^{20}/cm^3$ and lower than or equal to $1\times10^{21}/cm^3$. The oxide conductive layer 212 is provided between the oxide semiconductor layer 210 and the second electrode layer 214, so that contact resistance can be reduced, which contributes to high speed operation of a transistor. Therefore, frequency characteristics of a driver circuit can be improved.

It is preferable that the oxide conductive layer 212 be formed to be thinner than the oxide semiconductor layer 210 which is used as a channel formation region.

The oxide conductive layer 212 may be formed in such a manner that an oxide conductive film (e.g., In—Ga—Zn—O-based non-single-crystal film) is formed with a sputtering method. The film formation condition of the oxide conductive film is different from the film formation condition of the oxide semiconductor film. For example, the flow rate of the oxygen gas in an introduced gas is preferably high when an In—Ga—Zn—O-based non-single-crystal film to serve as an oxide semiconductor is formed. Specifically, the In—Ga—Zn—O-based non-single-crystal film to serve as an oxide conductive film is formed in a noble gas atmosphere (or an oxygen gas may be contained at a ratio of less than or equal to 10%), whereas the In—Ga—Zn—O-based non-single-crystal film to serve as an oxide semiconductor film is formed in an oxygen atmosphere (or a noble gas may be contained at a ratio of less than 50%).

The oxide semiconductor film to serve as the oxide semiconductor layer 210 and the oxide conductive film to serve as the oxide conductive layer 212 may be formed in the same chamber or in different chambers.

Through the above steps, the first transistor and the second transistor can be formed.

Note that the first transistor and the second transistor illustrated in FIGS. 8A, 8B, 8C1, and 8C2 are bottom-gate thin film transistors in which an oxide semiconductor is used for a semiconductor layer; however, one embodiment of the present invention is not limited to this, and top-gate thin film transistors may be used.

Next, a second insulating layer 216 is formed over the first insulating layer 206, the oxide semiconductor layer 210, and the second electrode layer 214 (see FIG. 8C1). The second insulating layer 216 can be formed to a thickness at least greater than or equal to 1 nm with a sputtering method, or the like, as appropriate, which is a method with which impurities such as water or hydrogen are not mixed into the oxide semiconductor layer 210. The second insulating layer 216 in contact with the oxide semiconductor layer 210 may be formed using an inorganic insulating film which does not contain impurities such as water or a hydrogen ion and which can prevent entry of these from the outside. For example, silicon oxide, silicon nitride oxide, aluminum oxide, aluminum oxynitride, or the like can be used. The second insulating layer 216 is preferably formed with a sputtering method.

Note that the conductivity of the oxide semiconductor layer 210 excessively improves because of the heat treatment for dehydration or dehydrogenation. A film containing a large amount of oxygen (e.g., a silicon oxide film formed with a sputtering method) is used for the second insulating layer 216, so that the resistance of a channel formation region of the oxide semiconductor layer 210 increases and the conductivity is appropriate. Specifically, the carrier concentration is preferably less than $1\times10^{18}/cm^3$. Therefore, part of the oxide semiconductor layer 210 which does not have high resistance and which overlaps with the second electrode layer 214 is deficient in oxygen. This region is referred to as a high-resistance drain (HRD) region or a high-resistance source (HRS) region. Here, the carrier concentration of this region is greater than or equal to $1\times10^{18}/cm^3$ and at least higher than the carrier concentration of the channel formation region. Here, the carrier concentration is calculated from the Hall effect measurement at room temperature. The carrier concentration of the second insulating layer 216 is controlled in this manner, so that the distance between the source electrode and the drain electrode is regulated, whereby the channel length L can be controlled.

Note that a method for increasing the resistance of the portion of the oxide semiconductor layer 210 to serve as a channel formation region is not limited to a method in which the second insulating layer 216 is formed, and may be a method by which heat treatment is performed after the second insulating layer 216 is formed. The heat treatment here is preferably performed in an oxygen atmosphere. Alternatively, cooling performed after the heat treatment may be performed in an oxygen atmosphere or an ultra dry air.

Next, a contact hole is formed in a desired portion of the second insulating layer 216 so as to expose the second electrode layer 214, and a third conductive layer is formed over the second electrode layer 214 through the contact hole. The third conductive layer functions as a pixel electrode.

Although not illustrated, it is preferable that a conductive layer be formed over the second insulating layer 216 which overlaps with the channel formation region. This conductive layer may be the third conductive layer or another layer.

The third conductive layer can be formed using a conductive composition containing a conductive high molecule (also referred to as a conductive polymer) having a light-transmitting property. As the conductive macromolecule, a so-called π-electron conjugated conductive macromolecule can be used. Examples thereof include polyaniline and derivatives thereof, polypyrrole and derivatives thereof, polythiophene and derivatives thereof, and copolymers of two or more kinds of them. Alternatively, the third conductive layer may be formed using, for example, indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like. The thickness of the third conductive layer is preferably greater than or equal to 10 nm and less than or equal to 1000 nm, more preferably, greater than or equal to 50 nm and less than or equal to 300 nm The third conductive layer may be formed using a sputtering method and a photolithography method or an ink-jet method.

Then, over another substrate used as a counter substrate, at least a conductive layer may be formed in a manner similar to that of the third conductive layer, and the substrate 200 and the counter substrate may be attached to each other with a sealant or the like, so that a liquid crystal material may be injected. A blue-phase liquid crystal for which an alignment film is not necessary is preferably used for the liquid crystal material. The blue phase is a kind of liquid crystal phase and appears just before phase transition from a cholesteric phase to an isotropic phase when the temperature of a cholesteric liquid crystal is increased. Since the blue phase appears only in a narrow temperature range, a liquid crystal composition in which 5 wt. % or more of a chiral material is mixed is used for the liquid crystal layer 174 in order to improve the temperature range. As for the liquid crystal composition which contains a blue-phase liquid crystal and a chiral material, the response speed is as high as 10 μs is to 100 μs, alignment treatment is not necessary due to optical isotropy, and viewing angle dependence is low.

Note that when different one from a blue phase is used for the liquid crystal material, each of the third conductive layer and the conductive layer over the counter substrate may be provided with an alignment film.

The structure of a liquid crystal display device which is formed as described above will be described with reference to block diagrams illustrated in FIGS. 9A and 9B.

Figure 9A:
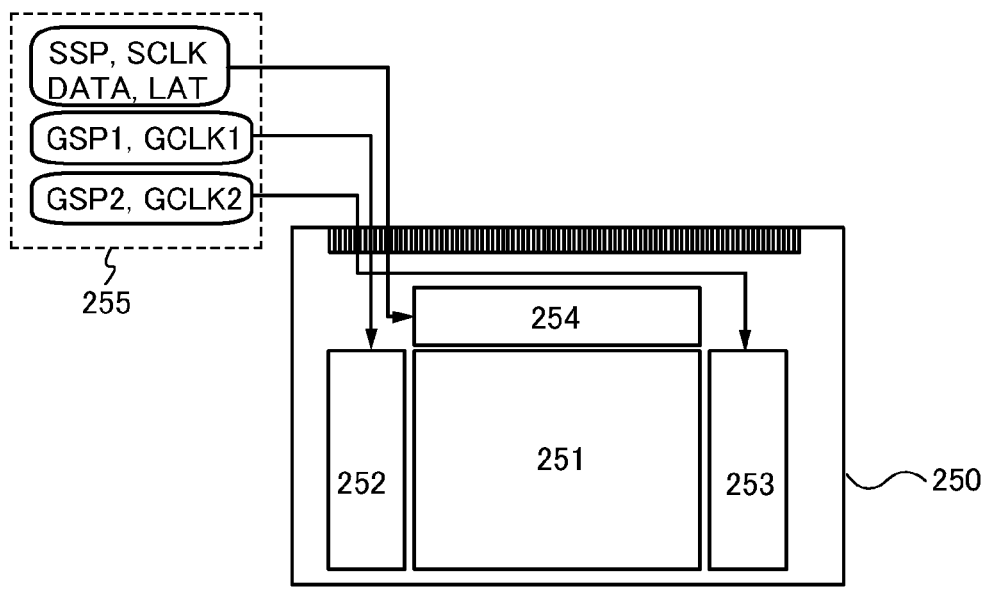
FIGS. 9A and 9B are diagrams each illustrating an example of a display device which is one embodiment of the present invention.

FIG. 9A illustrates an example of a block diagram of an active matrix liquid crystal display device which is formed as described above. On a substrate 250, a pixel portion 251, a first scan line driver circuit 252, a second scan line driver circuit 253, and a signal line driver circuit 254 are provided. In the pixel portion 251, a plurality of signal lines connected to the signal line driver circuit 254 is arranged and a plurality of scan lines connected to the first scan line driver circuit 252 and the second scan line driver circuit 253 is arranged. Note that pixels which include display elements are provided in a matrix in respective regions where the scan lines and the signal lines intersect with each other. The substrate 250 of the display device is connected to a timing control circuit 255 (also referred to as a controller or a control IC) through a connection point such as a flexible printed circuit (FPC).

In FIG. 9A, the first scan line driver circuit 252, the second scan line driver circuit 253, and the signal line driver circuit 254 are formed over the substrate 250 provided with the pixel portion 251. Accordingly, the number of components such as a driver circuit provided in an external portion is reduced, which can lead to a narrow frame and cost reduction. Compared to the case where a driver circuit is provided outside the substrate 250 and connected thereto, the number of connection points can be reduced, which can lead to improvement in yield and reliability.

Note that the timing control circuit 255 supplies, for example, a first scan line drive circuit start signal GSP1 (a start signal is also referred to as a start pulse) and a scan line drive circuit clock signal GCLK1 to the first scan line drive circuit 252. Furthermore, the timing control circuit 255 supplies, for example, a second scan line drive circuit start signal GSP2 and a scan line drive circuit clock signal GCLK2 to the second scan line drive circuit 253. Moreover, the timing control circuit 255 supplies a signal line drive circuit start signal SSP, a signal line drive circuit clock signal SCLK, video signal data DATA (also simply referred to as a video signal), and a latch signal LAT to the signal line drive circuit 254. Each clock signal may be a plurality of clock signals with shifted phases or may be supplied together with a signal CLKB obtained by inverting the clock signal. Note that only one of the first scan line driver circuit 252 and the second scan line driver circuit 253 may be provided.

Figure 9B:
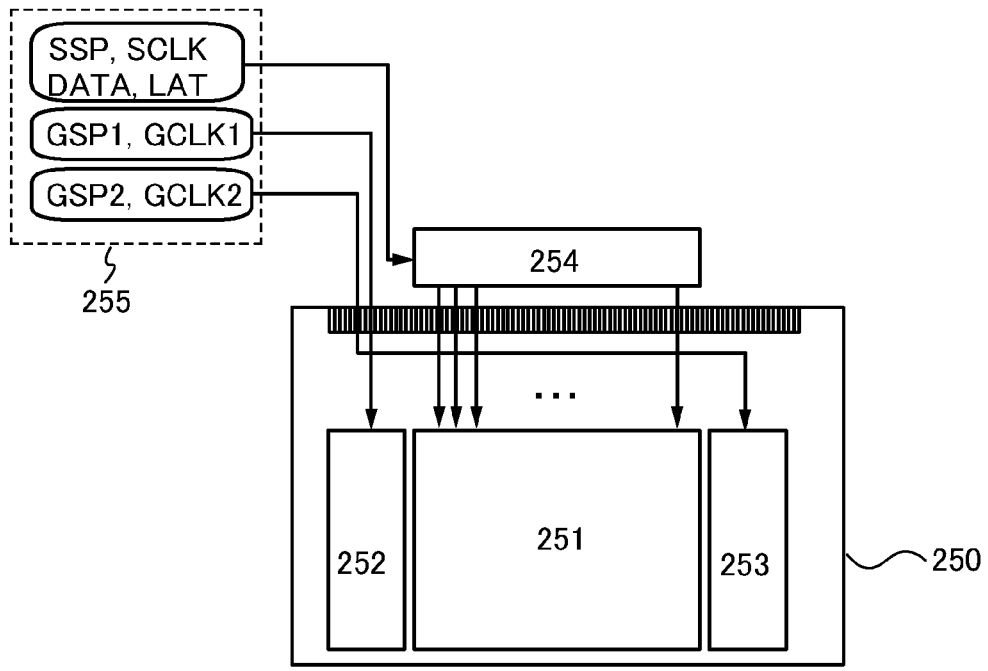

Without limitation to the above, as illustrated in FIG. 9B, a scan line driver circuit with low driving frequency may be formed over the substrate 250 and connected to a signal line driver circuit with high driving frequency formed over a substrate which is different from the substrate 250.

In FIG. 9B, the first scan line driver circuit 252 and the second scan line driver circuit 253 are formed over the substrate 250 provided with the pixel portion 251, and the signal line driver circuit 254 formed over a substrate which is different from the substrate 250 (e.g., a single crystal substrate) is connected to the substrate 250. Such a structure enables a driver circuit formed over the substrate 250 using a thin film transistor having low field effect mobility, compared with a transistor formed using a single crystal semiconductor. Therefore, also by the structure illustrated in FIG. 9B, the number of processes and cost can be decreased, and yield can be improved.

According to this embodiment, a thin film transistor having high field effect mobility can be formed over a large substrate, and a driver circuit and a pixel circuit can be formed over the same substrate; therefore, a high value-added display device which is, for example, capable of double-frame rate driving can be provided. Such a display device can be formed using, for example, an oxide semiconductor as described in this embodiment; however, one embodiment of the present invention is not limited to this, and a thin film transistor formed using, for example, microcrystalline silicon may be used.

In this embodiment, a liquid crystal display device is described as an example of a display device which is one embodiment of the present invention; however, one embodiment of the present invention is not limited to this, and the display device which is one embodiment of the present invention can be applied to an EL display device having an organic EL element.

This embodiment can be implemented in appropriate combination with the structures described in any of the other embodiments.

(Embodiment 3)

In this embodiment, an example of a display device which is different from that in Embodiment 2 will be described. Specifically, electronic paper formed using an electrophoresis element will be described.

Figure 10A:
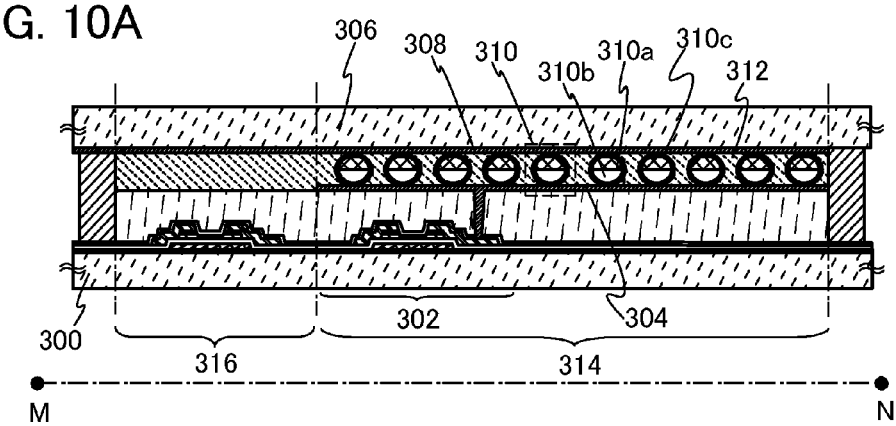
FIGS. 10A to 10C are diagrams each illustrating an example of a display device which is one embodiment of the present invention.
Figure 10B:
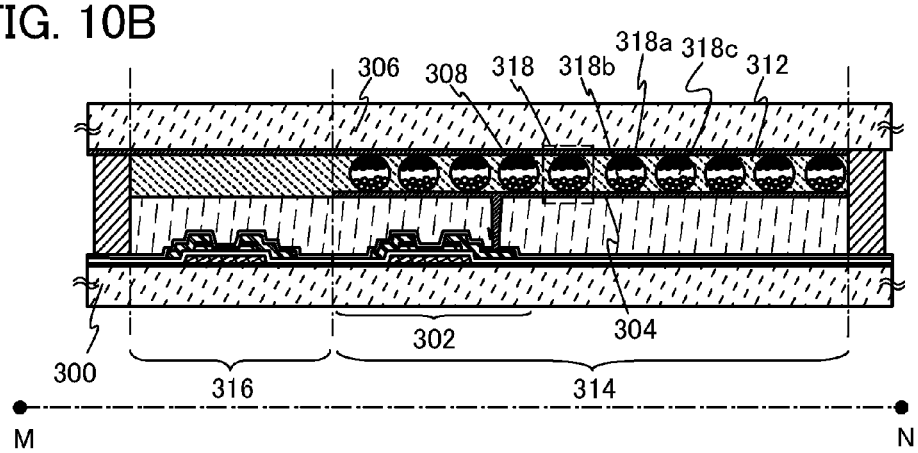
Figure 10C:
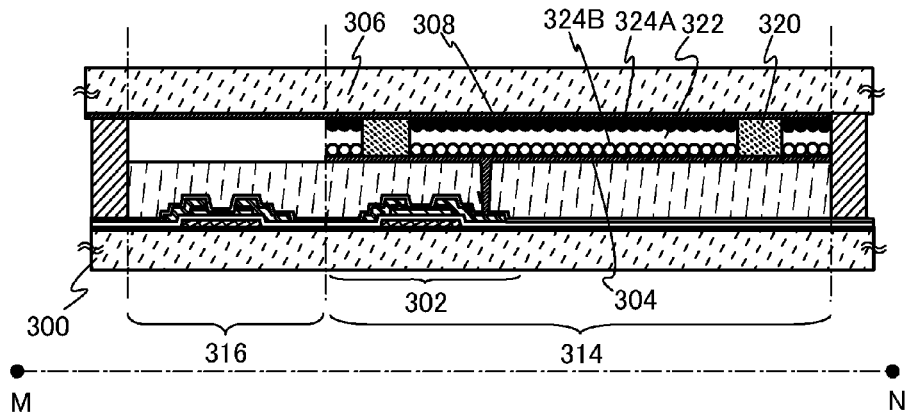

FIGS. 10A to 10C are cross-sectional views in which active matrix electronic paper is used as a display panel. Electronic paper has visibility as high as paper, consumes lower power than other display panels, and can be made thin and lightweight.

FIG. 10A is a cross-sectional view of electronic paper using a twist ball method. A twist ball method is a method in which spherical particles each colored in black and white are arranged between electrode layers included in a display element and the orientation of the spherical particles is controlled with the use of voltage between the electrode layers to display an image.

Electronic paper using a twist ball method which is illustrated in FIG. 10A includes a display portion 314 and a driver circuit portion 316. The display portion 314 includes a first electrode layer 304 connected to a thin film transistor 302 over a substrate 300, a second electrode layer 308 provided on a substrate 306, and spherical particles 310 arranged between the first electrode layer 304 and the second electrode layer 308. The spherical particles 310 each include a black region 310a, a white region 310b, and a cavity 310c filled with a liquid around the black region and the white region. A space around the spherical particles 310 is filled with a filler 312 such as an organic resin. The second electrode layer 308 corresponds to a common electrode (a counter electrode) and is electrically connected to a common potential line. Note that the driver circuit portion 316 includes a thin film transistor formed through the same process as the thin film transistor 302 in the display portion 314.

FIG. 10B is a cross-sectional view of electronic paper using an electrophoretic element method. In FIG. 10B, microcapsules 318 are used instead of the spherical particles 310 in FIG. 10A. The microcapsules 318 each includes a transparent liquid 318c, a negatively charged black particle 318a, and a positively charged white particle 318b. The microcapsules 318 each have a diameter of approximately 10 μm to 200 μm.

In the microcapsules 318 provided between the first electrode layer 304 and the second electrode layer 308, when an electric field is generated by the first electrode layer 304 and the second electrode layer 308, the white particles 318b as first particles and the black particles 318a as second particles move in opposite directions, so that white or black can be displayed. A display element using this principle is an electrophoretic display element. An electrophoretic display element has high reflectivity, and thus, an auxiliary light is unnecessary, power consumption is low, and high visibility is provided even in a dim place. Moreover, an image which has been displayed once can be retained even if no power is supplied to the display portion.

Note that the first particles and the second particles each include a pigment, and do not move when there is no potential gradient. The colors of the first particles and the second particles are not limited to black and white, and any color may be used for the first particles and the second particles as long as the colors of the first particles and the second particles are different from each other (the colors include achromatic color).

A solution in which the aforementioned microcapsules are dispersed in a solvent is referred to as electronic ink. This electronic ink can be printed on a surface of glass, plastic, cloth, paper, or the like. Furthermore, by using a color filter or particles that have a dye, color display can also be achieved.

Note that the first particles and the second particles in the microcapsules 318 may be formed using a single material selected from a conductive material, an insulating material, a semiconductor material, a magnetic material, a liquid crystal material, a ferroelectric material, an electroluminescent material, an electrochromic material, or a magnetophoretic material, or formed using a composite material of any of these.

FIG. 10C is a cross-sectional view of electronic paper using a method using an electronic liquid powder. Positively charged black liquid powder 324A and negatively charged white liquid powder 324B are contained in a space 322 surrounded by the first electrode layer 304, the second electrode layer 308, and a rib 320. Note that the space 322 may be filled with, for example, an air.

With a potential gradient generated by the first electrode layer 304 and the second electrode layer 308, the black liquid powder 324A and the white liquid powder 324B move in opposite directions, so that white or black can be displayed. As the liquid powders, color powders of red, yellow, and/or blue may be used.

In FIGS. 10A to 10C, a light-transmitting plastic substrate or the like can be used as the substrate 300. Here, as the plastic substrate, a fiberglass-reinforced plastics (FRP) plate, a polyvinyl fluoride (PVF) film, a polyester film, or an acrylic resin film can be used, for example. Alternatively, a sheet in which aluminum foil is interposed between PVF films or polyester films can be used.

When a plastic substrate or the like is used for the substrate 300, for example, a separation layer is formed over a glass substrate, an element is formed over the separation layer, an upper surface of the element is bonded to another substrate, and the separation layer is removed, so that the element may be transferred to the plastic substrate from the another substrate. Here, for example, tungsten oxide can be used for the separation layer. The separation layer is preferably formed with tungsten oxide, so that separation can be performed using water, which is preferable. The another substrate may also be a plastic substrate.

According to this embodiment, a thin film transistor having high field effect mobility can be formed over a large substrate, and a driver circuit and a pixel circuit can be formed over the same substrate; therefore, high value-added electronic paper which is, for example, capable of double-frame rate driving can be provided.

In this embodiment, an example of electronic paper formed using an electrophoresis element or the like which is one embodiment of the present invention is described; however, one embodiment of the present invention is not limited to this, and electronic paper of another embodiment may be used. For example, electronic paper in which a liquid crystal element or an EL element is used for a display element may be used.

This embodiment can be implemented in appropriate combination with the structures described in any of the other embodiments.

(Embodiment 4)

In this embodiment, electronic devices in which the display device described in Embodiment 2 and Embodiment 3 is applied to a display portion will be described.

As examples of the electronic devices in which the display device of Embodiment 2 is applied to the display portion, the following can be given: cameras such as video cameras and digital cameras, goggle type displays, navigation systems, audio replay devices (e.g., car audio systems and audio systems), computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display that can display an image), and the like.

Figure 11A:
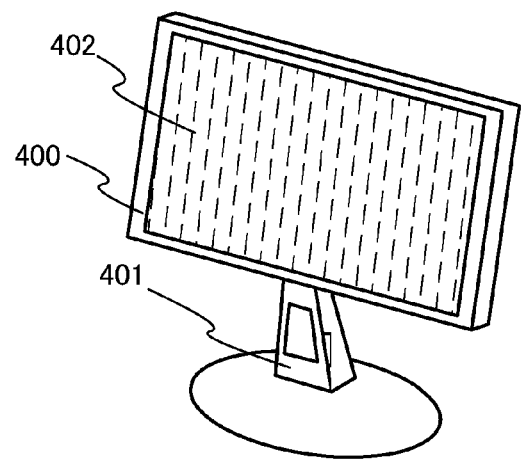
FIGS. 11A to 11C are diagrams illustrating examples of electronic devices each provided with a display device which is one embodiment of the present invention.

The display illustrated in FIG. 11A includes a housing 400, a support base 401, and a display portion 402, and has a function of displaying a variety of input information (e.g., still images, moving images, and text images) on the display portion 402. Note that the function included in the display illustrated in FIG. 11A is not limited to this, and for example, the display can be provided with a speaker, and the display may be a touch panel through which information can be not only displayed but input.

Figure 11B:
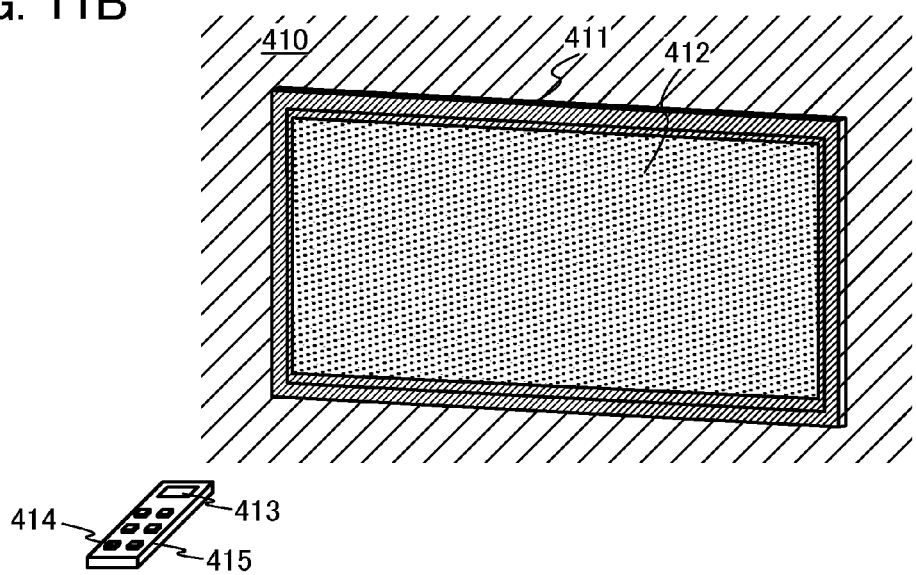

In the television set illustrated in FIG. 11B, a display portion 412 is incorporated in a housing 411. Images can be displayed on the display portion 412. Illustrated in FIG. 11B is the structure in which the rear side of the housing is supported by fixing to a wall 410.

The television set illustrated in FIG. 11B can be operated by an operation switch of the housing 411 or a remote controller 415. The channel and volume can be controlled with operation keys 414 of the remote controller 415 and the images displayed in the display portion 412 can be controlled. Furthermore, the remote controller 415 may be provided with a display portion 413 for displaying information output from the remote controller 415.

Note that the television set illustrated in FIG. 11B is provided with a receiver, a modem, and the like. With the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 11C:
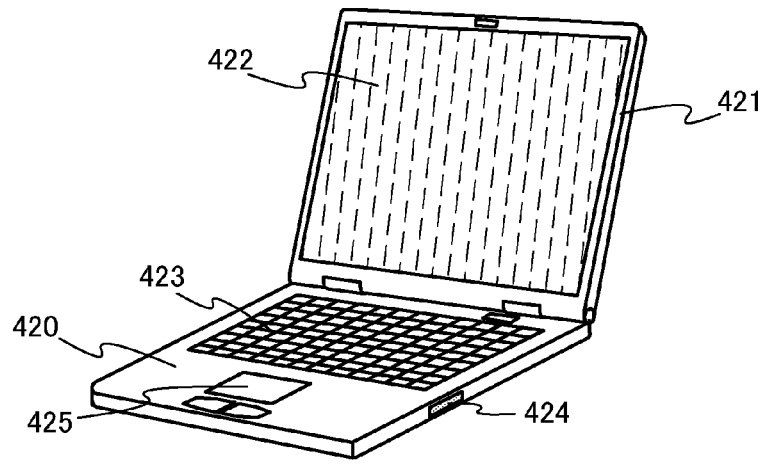

The computer illustrated in FIG. 11C includes a main body 420, a housing 421, a display portion 422, a keyboard 423, an external connection port 424, and a pointing device 425, and has a function of displaying a variety of information (e.g., still images, moving images, and text images) on the display portion 422. Note that the computer illustrated in FIG. 11C is not limited to this function, and for example, may include a function of a touch panel which can input information as well as displaying information.

The display device described in Embodiment 2 is used for the display portion of the electronic device described in this embodiment, so that the high value-added display device which has the display portion with double-frame rate driving can be provided.

This embodiment can be combined with any of the other embodiments as appropriate.

EXAMPLE 1

In this example, as a specific example of the inverter circuit 100 described in Embodiment 1, calculation results of input-output characteristics are shown on the assumption that threshold voltage Vth changes from an initial value of 1.0 V to a negative value (normally ON characteristics). The values of various bias potentials and power supply potentials were set as follows. That is, the following formulae were satisfied: Vbias2=Vss1+2Vth, Vss2=Vss2 (initial value)+ΔVbias2+ΔVth=Vss2 (initial value)+3 (Vth−Vth (initial value)), and Vbias1=Vbias1 (initial value)+Vth−Vth (initial value). Note that the following formulae were satisfied: Vss1=Vss2 (initial value)=0V, Vth (initial value)=1.0 V, and Vbias1 (initial value)=Vdd=10.0 V. The threshold voltage Vth was 1.0 V to −0.5 V.

Note that in FIG. 12, FIG. 13, FIG. 14, and FIG. 15, Vss1 is denoted as Vss, whereas Vbias1 is denoted as Vbias.

Figure 12:
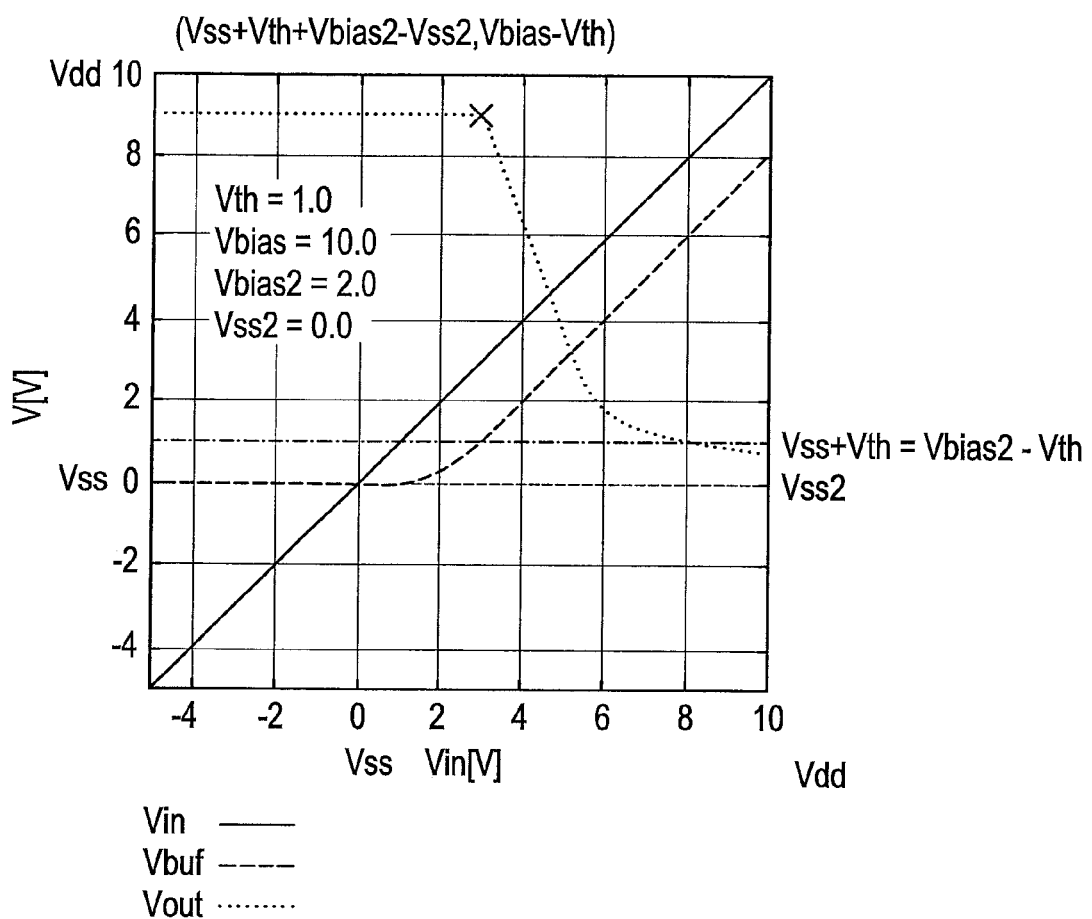
FIG. 12 is a graph showing Example 1.
Figure 13:
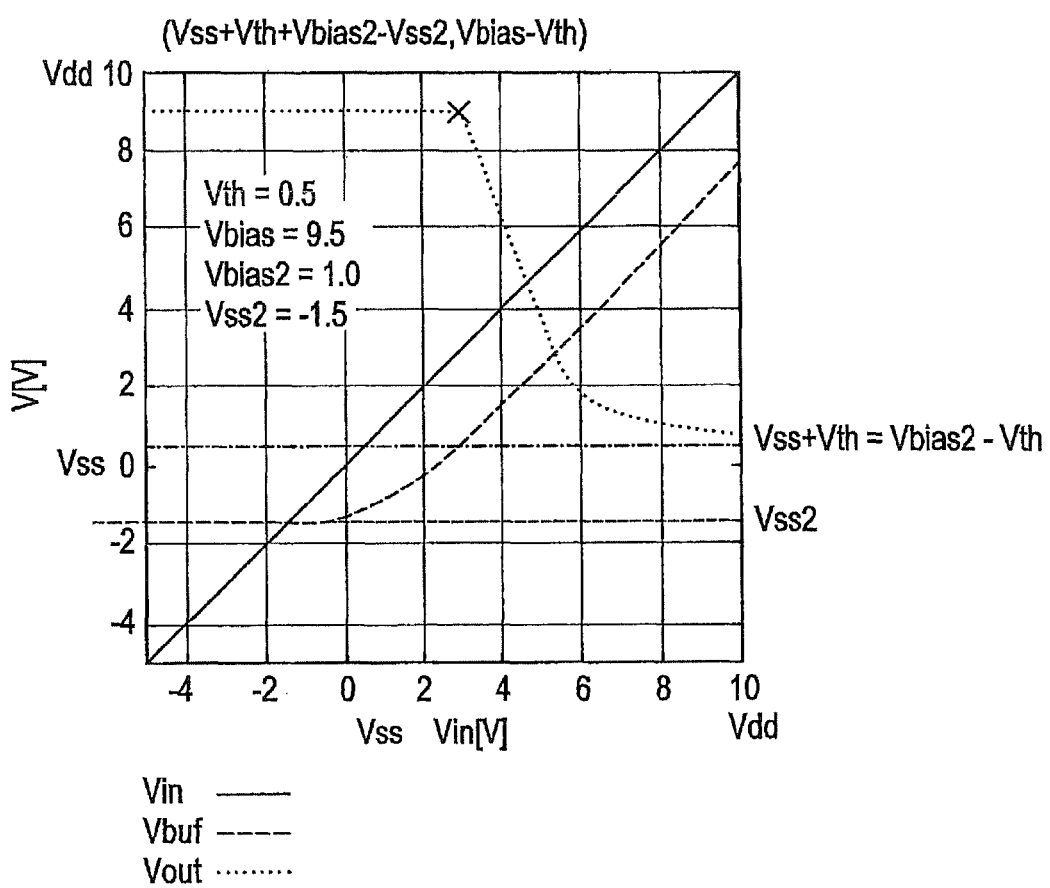
FIG. 13 is a graph showing Example 1.
Figure 14:
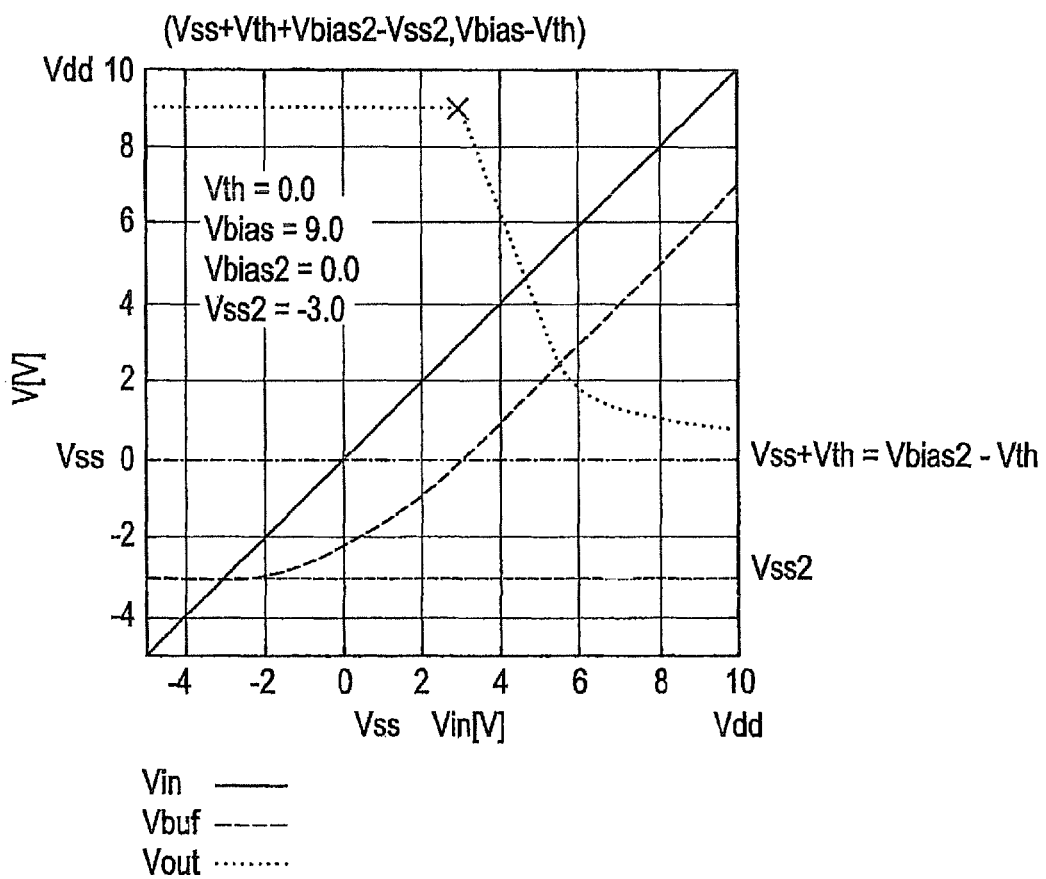
FIG. 14 is a graph showing Example 1.
Figure 15:
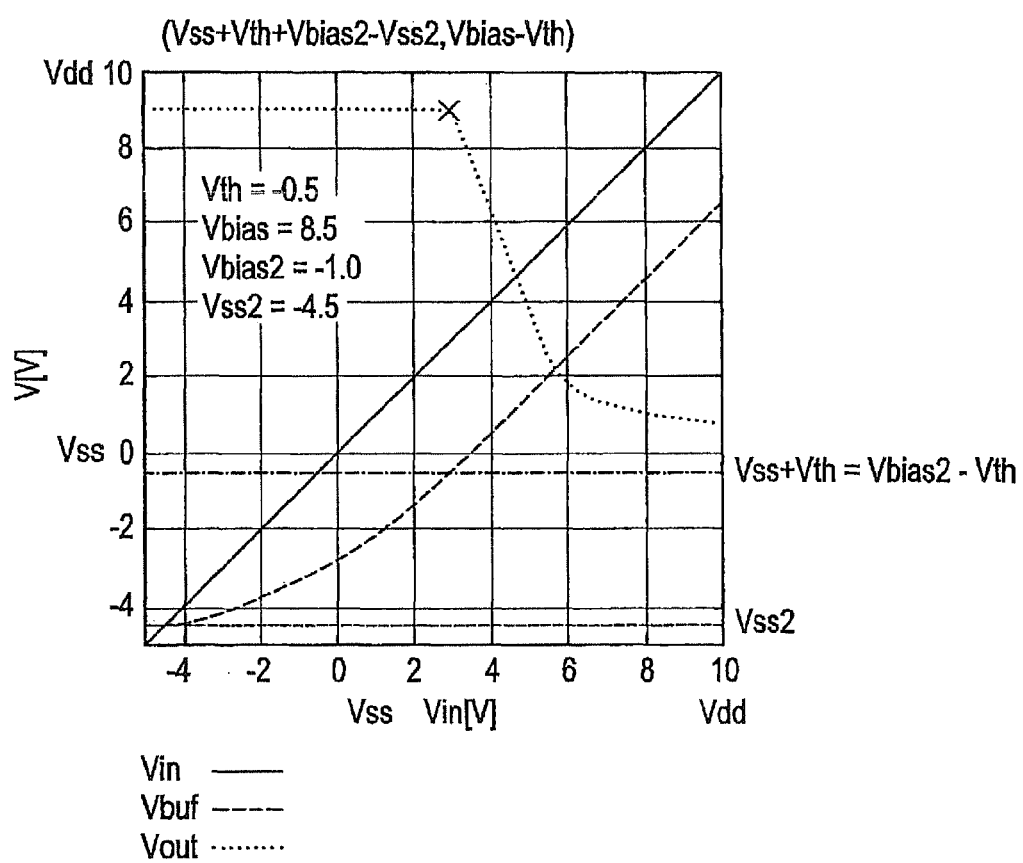
FIG. 15 is a graph showing Example 1.

FIG. 12 shows input output characteristics obtained when the threshold voltage Vth is 1.0 V. FIG. 13 shows input output characteristics obtained when the threshold voltage Vth is 0.5 V. FIG. 14 shows input output characteristics obtained when the threshold voltage Vth is 0 V. FIG. 15 shows input output characteristics obtained when the threshold voltage Vth is −0.5 V. In FIG. 12, FIG. 13, FIG. 14, and FIG. 15, it is found that even when the threshold voltage Vth changes, an output performance diagram does not change at all.

As shown in the calculation results in this example, a logic circuit can be formed using only depletion n-channel transistors.

Note that Vin−Vbuf can be controlled by Vss2 and Vbias2, so that one embodiment of the present invention is particularly effective in a circuit formed using a transistor which is initially an enhancement transistor but is changed over time to be a depletion transistor.

This application is based on Japanese Patent Application serial no. 2009-235165 filed with Japan Patent Office on Oct. 9, 2009, the entire contents of which are hereby incorporated by reference.

EXPLAINATION OF REFERENCE

100: inverter circuit, 102: source follower circuit, 102A: source follower circuit, 102B: source follower circuit, 102C: source follower circuit, 104: inverter circuit, 106: transistor, 108: transistor, 110: transistor, 112: transistor, 114: node, 120: NAND circuit, 122: transistor, 124: transistor, 126: transistor, 130: NOR circuit, 132: transistor, 134: transistor, 136: transistor, 140: NAND circuit, 142: transistor, 144: transistor, 146: transistor, 148: transistor, 150: NOR circuit, 152: transistor, 154: transistor, 156: transistor, 158: transistor, 200: substrate, 202: base film, 204: first electrode layer, 206: first insulating layer, 208: opening, 210: oxide semiconductor layer, 212: oxide conductive layer, 214: second electrode layer, 216: second insulating layer, 250: substrate, 251: pixel portion, 252: scan line driver circuit, 253: scan line driver circuit, 254: signal line driver circuit, 255: timing control circuit, 300: substrate, 302: thin film transistor, 304: first electrode layer, 306: substrate, 308: second electrode layer, 310: spherical particle, 310a: black region, 310b: white region, 310c: cavity, 312: filler, 314: display portion, 316: driver circuit portion, 318: microcapsule, 318a: black particle, 318b: white particle, 318c: liquid, 320: rib, 322: space, 324A: black liquid powder, 324B: white liquid powder, 400: housing, 401: support base, 402: display portion, 410: wall, 411: housing, 412: display portion, 413: display portion, 414: operation key, 415: remote controller, 420: main body, 421: housing, 422: display portion, 423: keyboard, 424 external connection port, and 425: pointing device.

The invention claimed is:
1. A semiconductor device comprising:
a source follower circuit comprising an input portion, an output portion, and a bias input portion;
a logic circuit comprising an input portion electrically connected to the output portion of the source follower circuit, the logic circuit comprising a transistor;
a first wiring electrically connected to the source follower circuit, the first wiring being adapted to be supplied with a first constant low potential;

a second wiring electrically connected to the logic circuit, the second wiring being adapted to be supplied with a second constant low potential;

a third wiring electrically connected to the source follower circuit, the third wiring being adapted to be supplied with a first constant high potential; and a fourth wiring electrically connected to the logic circuit, the fourth wiring being adapted to be supplied with a second constant high potential, wherein the first constant low potential is lower than the second constant low potential.

2. The semiconductor device according to claim 1, wherein the logic circuit is an inverter circuit.

3. The semiconductor device according to claim 1, wherein the transistor is part of a NOR circuit.

4. The semiconductor device according to claim 1, wherein the transistor is part of a NAND circuit.

5. The semiconductor device according to claim 1, wherein the transistor is an n-channel depletion transistor having a negative threshold voltage.

6. The semiconductor device according to claim 1, wherein the transistor comprises a semiconductor layer formed using an oxide semiconductor.

7. The semiconductor device according to claim 1, wherein the source follower circuit further comprises a transistor, a gate of the transistor and a source of the transistor being electrically connected to the bias input portion of the source follower circuit and to the first wiring, respectively.

8. The semiconductor device according to claim 7, wherein the gate and the source of the transistor of the source follower can be at different electric potential from each other.

9. The semiconductor device according to claim 1, the source follower circuit further comprising a transistor; the logic circuit further comprising a bias input portion, wherein the transistor of the source follower is electrically connected to the bias input portion of the source follower circuit, and wherein the bias input portion of the logic circuit is electrically connected to a gate of the transistor of the logic circuit.

10. A semiconductor device comprising:

a source follower circuit comprising an input portion, an output portion, and a bias input portion;

a logic circuit comprising an input portion electrically connected to the output portion of the source follower circuit, the logic circuit comprising a plurality of transistors;

a first wiring electrically connected to the source follower circuit, the first wiring being adapted to be supplied with a first constant low potential;

a second wiring electrically connected to the logic circuit, the second wiring being adapted to be supplied with a second constant low potential;

a third wiring electrically connected to the source follower circuit, the third wiring being adapted to be supplied with a first high potential; and a fourth wiring electrically connected to the logic circuit, the fourth wiring being adapted to be supplied with a second high potential, wherein the first constant low potential is lower than the second constant low potential.

11. The semiconductor device according to claim 10, wherein the logic circuit is an inverter circuit.

12. The semiconductor device according to claim 10, wherein the transistors are part of a NOR circuit.

13. The semiconductor device according to claim 10, wherein the transistors are part of a NAND circuit.

14. The semiconductor device according to claim 10, wherein the plurality of transistors each are an n-channel depletion transistor comprising an oxide semiconductor and having a negative threshold voltage.

15. The semiconductor device according to claim 10, wherein the transistors each comprise a semiconductor layer formed using an oxide semiconductor.

16. The semiconductor device according to claim 10, wherein the source follower circuit further comprises a transistor, a gate of the transistor and a source of the transistor being electrically connected to the bias input portion of the source follower circuit and to the first wiring, respectively.

17. The semiconductor device according to claim 16, wherein the gate and the source of the transistor of the source follower can be at different electric potential from each other.

18. The semiconductor device according to claim 10, the source follower circuit further comprising a transistor; the logic circuit further comprising a bias input portion, wherein the transistor of the source follower is electrically connected to the bias input portion of the source follower circuit, and wherein the bias input portion of the logic circuit is electrically connected to a gate of one of the transistor of the logic circuit.

19. A semiconductor device comprising:

a logic circuit comprising;

an input portion, an output portion, a first transistor, a second transistor, a third transistor and a fourth transistor;

one of a source and a drain of the first transistor electrically connected to a first wiring, the first wiring being adapted to be supplied with a constant high potential;

a gate of the first transistor electrically connected to the input portion;

one of a source and a drain of the second transistor electrically connected to the other of the source and the drain of the first transistor;

the other of the source and the drain of the second transistor electrically connected to a second wiring, the second wiring being adapted to be supplied with a first constant low potential;

a gate of the second transistor electrically connected to a third wiring, the third wiring being adapted to be supplied with a first constant potential;

one of a source and a drain of the third transistor electrically connected to a fourth wiring, the fourth wiring being adapted to be supplied with the constant high potential;

a gate of the third transistor electrically connected to a fifth wiring, the fifth wiring being adapted to be supplied with a second constant potential;

one of a source and a drain of the fourth transistor electrically connected to the other of the source and the drain of the third transistor;

the other of the source and the drain of the fourth transistor electrically connected to a sixth wiring, the sixth wiring being adapted to be supplied with a second constant low potential; and a gate of the fourth transistor electrically connected to a first electric node at the connection between the first transistor and the second transistor, wherein the output portion is electrically connected to a second electric node at the electric connection between the third transistor and the fourth transistor, and wherein the first constant low potential is lower than the second constant low potential.

20. The semiconductor device according to claim 19, wherein the logic circuit is an inverter circuit.

21. The semiconductor device according to claim 19, wherein the third transistor and the fourth transistor are part of a NOR circuit.

22. The semiconductor device according to claim 19, wherein the third transistor and the fourth transistor are part of a NAND circuit.

23. The semiconductor device according to claim 19, wherein the first constant potential can be different from the second constant potential.

24. The semiconductor device according to claim 19, wherein the first constant potential and the first low potential can be different.

25. The semiconductor device according to claim 19, the first transistor, the second transistor, the third transistor and the fourth transistor each are an n-channel depletion transistor comprising an oxide semiconductor and having negative threshold voltage.

26. The semiconductor device according to claim 19, wherein the transistors each comprise a semiconductor layer formed using an oxide semiconductor.

* * * * *